(12) United States Patent
Cho

(10) Patent No.: US 11,404,433 B2
(45) Date of Patent: Aug. 2, 2022

(54) VERTICAL MEMORY DEVICES

(71) Applicant: SAMSUNG ELECTRONICS CO., LTD., Suwon-si (KR)

(72) Inventor: Wonseok Cho, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 127 days.

(21) Appl. No.: 16/799,947

(22) Filed: Feb. 25, 2020

(65) Prior Publication Data

US 2020/0402998 A1 Dec. 24, 2020

(30) Foreign Application Priority Data

Jun. 20, 2019 (KR) .................. 10-2019-0073588

(51) Int. Cl.
| | | |
|---|---|---|
| *H01L 27/11565* | (2017.01) | |
| *H01L 21/28* | (2006.01) | |
| *H01L 29/792* | (2006.01) | |
| *H01L 27/11582* | (2017.01) | |
| *H01L 27/1157* | (2017.01) | |
| *H01L 29/423* | (2006.01) | |
| *H01L 29/78* | (2006.01) | |

(52) U.S. Cl.
CPC .... *H01L 27/11582* (2013.01); *H01L 27/1157* (2013.01); *H01L 27/11565* (2013.01); *H01L 29/42352* (2013.01); *H01L 29/7827* (2013.01); *H01L 29/7926* (2013.01)

(58) Field of Classification Search
CPC ........... H01L 27/11582; H01L 27/1157; H01L 29/7926; H01L 29/42352; H01L 29/7827; H01L 27/11565; H01L 29/40117; H01L 27/11568; H01L 27/11563; H01L 29/792
See application file for complete search history.

(56) References Cited

U.S. PATENT DOCUMENTS

| | | | |
|---|---|---|---|
| 8,437,192 B2 | 5/2013 | Lung et al. | |
| 9,337,431 B2 | 5/2016 | Nishikawa et al. | |
| 9,666,594 B2 * | 5/2017 | Mizuno | ............... H01L 29/7923 |
| 9,806,089 B2 | 10/2017 | Sharangpani et al. | |
| 10,381,376 B1 * | 8/2019 | Nishikawa | .......... H01L 27/1157 |
| 2009/0225602 A1 | 9/2009 | Sandhu et al. | |

(Continued)

*Primary Examiner* — Shahed Ahmed
*Assistant Examiner* — Khatib A Rahman
(74) *Attorney, Agent, or Firm* — F. Chau & Associates, LLC

(57) ABSTRACT

A vertical memory device includes gate electrodes disposed on a substrate and spaced apart from each other in a vertical direction. A channel extends in the vertical direction and is positioned adjacent to the gate electrodes. A tunnel insulation pattern is disposed on a portion of an outer sidewall of the channel that is adjacent to each of the gate electrodes. Charge trapping pattern structures are disposed between the tunnel insulation pattern and each of the gate electrodes. Each of the charge trapping pattern structures includes upper and lower charge trapping patterns spaced apart from each other in the vertical direction. Blocking pattern structures are between the charge trapping patterns and each of the gate electrodes. A first portion of the channel that is adjacent to the tunnel insulation pattern has a thickness in a horizontal direction that is smaller than a thickness of other portions of the channel.

20 Claims, 26 Drawing Sheets

(56) References Cited

U.S. PATENT DOCUMENTS

| | | | |
|---|---|---|---|
| 2011/0147824 A1* | 6/2011 | Son | H01L 29/7827 |
| | | | 257/324 |
| 2015/0008499 A1* | 1/2015 | Lee | H01L 27/11582 |
| | | | 257/314 |
| 2016/0225786 A1* | 8/2016 | Lee | H01L 29/40117 |
| 2016/0315097 A1 | 10/2016 | Hsu | |
| 2016/0351582 A1* | 12/2016 | Kim | H01L 27/1157 |
| 2017/0062456 A1* | 3/2017 | Sugino | H01L 27/1157 |
| 2017/0148805 A1* | 5/2017 | Nishikawa | H01L 27/11524 |
| 2017/0271527 A1* | 9/2017 | Higuchi | H01L 27/1157 |
| 2018/0122959 A1* | 5/2018 | Calka | H01L 29/792 |
| 2018/0350827 A1 | 12/2018 | Dennison et al. | |
| 2019/0139983 A1* | 5/2019 | Lee | H01L 27/11524 |

* cited by examiner

VERTICAL MEMORY DEVICES

CROSS-REFERENCE TO RELATED APPLICATION

This application claims priority under 35 USC § 119 to Korean Patent Application No. 10-2019-0073588, filed on Jun. 20, 2019 in the Korean Intellectual Property Office, the disclosure of which is incorporated by reference in its entirety herein.

1. TECHNICAL FIELD

The present inventive concepts relate to vertical memory devices. More particularly, the present inventive concepts relate to nonvolatile memory devices having vertical channels.

2. DISCUSSION OF RELATED ART

The size of each vertically-stacked layer of vertical memory devices may be reduced to improve the degree of integration. However, there is a limitation for scaling down the size of each layer of a vertical memory device beyond a certain level.

SUMMARY

Exemplary embodiments of the present inventive concepts provide vertical memory devices having improved electrical characteristics.

According to an exemplary embodiment of the present inventive concepts, a vertical memory device includes gate electrodes disposed on a substrate and spaced apart from each other in a vertical direction substantially perpendicular to an upper surface of the substrate. A channel extends in the vertical direction and is positioned adjacent to the gate electrodes. A tunnel insulation pattern is disposed on a portion of an outer sidewall of the channel. The portion of the outer sidewall of the channel is adjacent to each of the gate electrodes. Charge trapping pattern structures are disposed between the tunnel insulation pattern and each of the gate electrodes. Each of the charge trapping pattern structures includes upper and lower charge trapping patterns spaced apart from each other in the vertical direction. Blocking pattern structures are disposed between the charge trapping patterns and each of the gate electrodes. A first portion of the channel that is adjacent to the tunnel insulation pattern has a thickness in a horizontal direction substantially parallel to the upper surface of the substrate that is smaller than a thickness of other portions of the channel.

According to an exemplary embodiment of the present inventive concepts, a vertical memory device includes gate electrodes disposed on a substrate and spaced apart from each other in a vertical direction substantially perpendicular to an upper surface of the substrate. A channel extends in the vertical direction, and is positioned adjacent to the gate electrodes. The channel includes a protrusion portion that protrudes in a horizontal direction substantially parallel to the upper surface of the substrate toward each of the gate electrodes. A tunnel insulation pattern is disposed on a portion of an outer sidewall of the channel adjacent to each of the gate electrodes and the protrusion portion of the channel in the horizontal direction. Charge trapping pattern structures are disposed between the tunnel insulation pattern and each of the gate electrodes. Each of the charge trapping pattern structures includes upper and lower charge trapping patterns spaced apart from each other in the vertical direction. Blocking pattern structures are disposed between the charge trapping patterns and each of the gate electrodes. A sidewall of each of the gate electrodes adjacent to the channel is concave along the horizontal direction.

According to an exemplary embodiment of the present inventive concepts, a vertical memory device includes gate electrodes disposed on a substrate and spaced apart from each other in a vertical direction substantially perpendicular to an upper surface of the substrate. A channel extends in the vertical direction and is positioned adjacent to the gate electrodes. The channel includes recesses formed on portions of an outer sidewall of the channel adjacent to each of the gate electrodes. The recesses are spaced apart from each other in the vertical direction. A tunnel insulation pattern fills each of the recesses and protrudes toward each of the gate electrodes in a horizontal direction substantially parallel to the upper surface of the substrate. Charge trapping pattern structures are disposed between the tunnel insulation pattern and each of the gate electrodes. Each of the charge trapping pattern structures includes upper and lower charge trapping patterns spaced apart from each other in the vertical direction. Blocking pattern structures are disposed between the charge trapping patterns and each of the gate electrodes.

According to an exemplary embodiment of the present inventive concepts, a method for manufacturing a vertical memory device includes forming gate electrodes on a substrate. The gate electrodes are spaced apart from each other in a vertical direction substantially perpendicular to an upper surface of the substrate. A channel extending in the vertical direction is formed and is positioned adjacent to the gate electrodes. A tunnel insulation pattern is formed on a portion of an outer sidewall of the channel. The portion of the outer sidewall of the channel is adjacent to each of the gate electrodes. The tunnel insulation pattern includes a protrusion portion that protrudes in a horizontal direction substantially parallel to the upper surface of the substrate towards an adjacent gate electrode farther than any other portion of the tunnel insulation pattern. Charge trapping pattern structures are formed between the tunnel insulation pattern and each of the gate electrodes. Each of the charge trapping pattern structures includes upper and lower charge trapping patterns spaced apart from each other in the vertical direction by the protrusion portion of the tunnel insulation pattern. Blocking pattern structures are formed between the charge trapping patterns and each of the gate electrodes.

A vertical memory device in accordance with exemplary embodiments of the present inventive concepts may include a tunnel insulation pattern, a charge trapping pattern structure and a blocking pattern structure formed on an outer sidewall of a channel that extends through gate electrodes and insulation patterns alternately and repeatedly formed in a vertical direction substantially perpendicular to an upper surface of a substrate, and the charge trapping pattern structure may include upper and lower charge trapping patterns spaced apart from each other in the vertical direction.

Accordingly, a plurality of charge trapping patterns may be arranged in one transistor, so that the integration degree of the vertical memory device including the transistor may be improved. Also, electrons may be efficiently injected through the plurality of charge trapping patterns, so that the electrical characteristic of the vertical memory device may be improved.

BRIEF DESCRIPTION OF THE DRAWINGS

FIGS. 3 to 9A, 10 to 22A and 23 are cross-sectional views taken along line A-A' of FIG. 1 illustrating stages of methods of manufacturing a vertical memory device according to exemplary embodiments of the present inventive concepts.

DETAILED DESCRIPTION OF THE EXEMPLARY EMBODIMENTS

Vertical memory devices and methods of manufacturing the same in accordance with exemplary embodiments of the present inventive concepts will be described more fully hereinafter with reference to the accompanying drawings.

Figure 1:
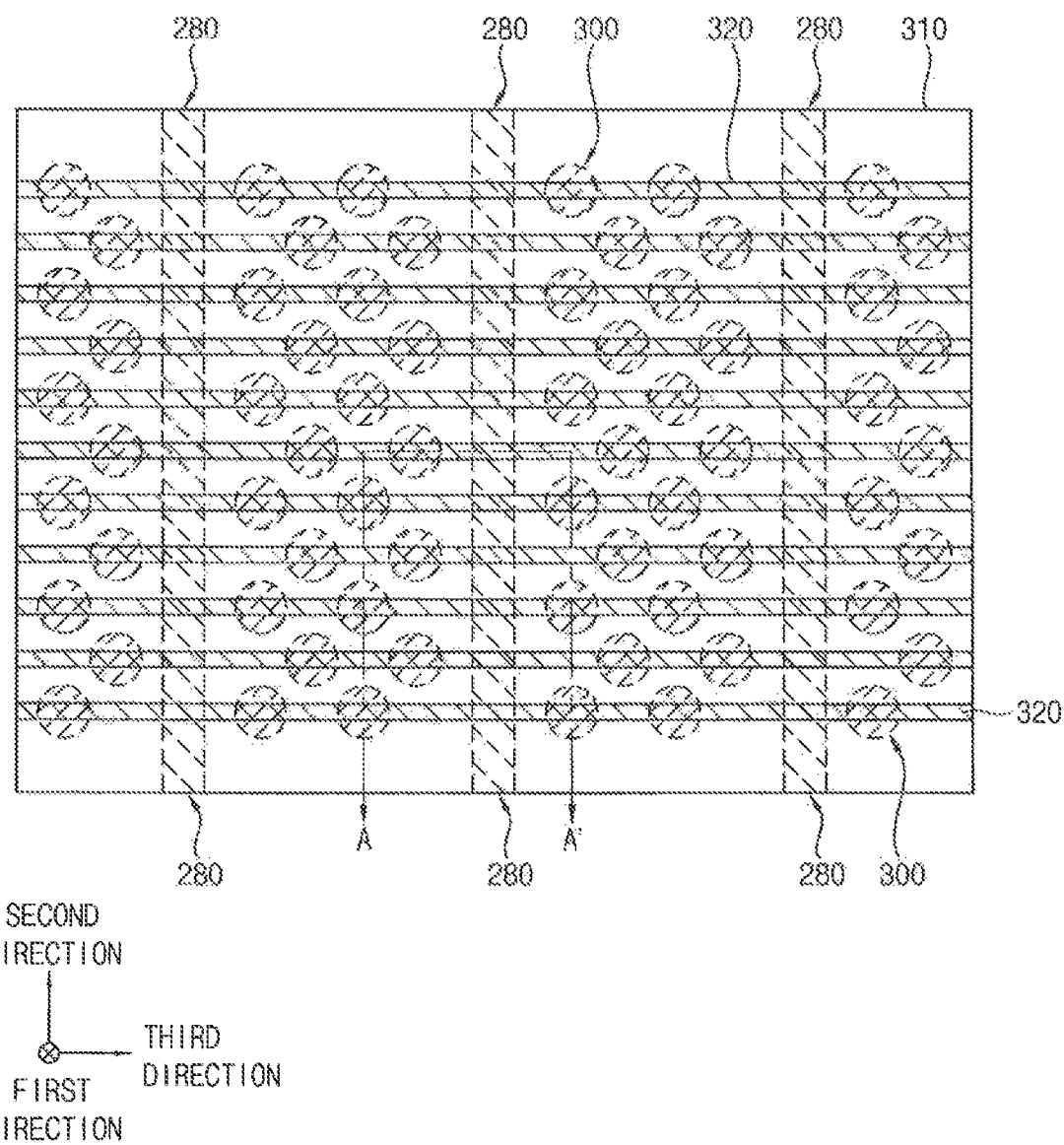
FIG. 1 is a top plan view illustrating a vertical memory device in accordance with an exemplary embodiment of the present inventive concepts.
Figure 2A:
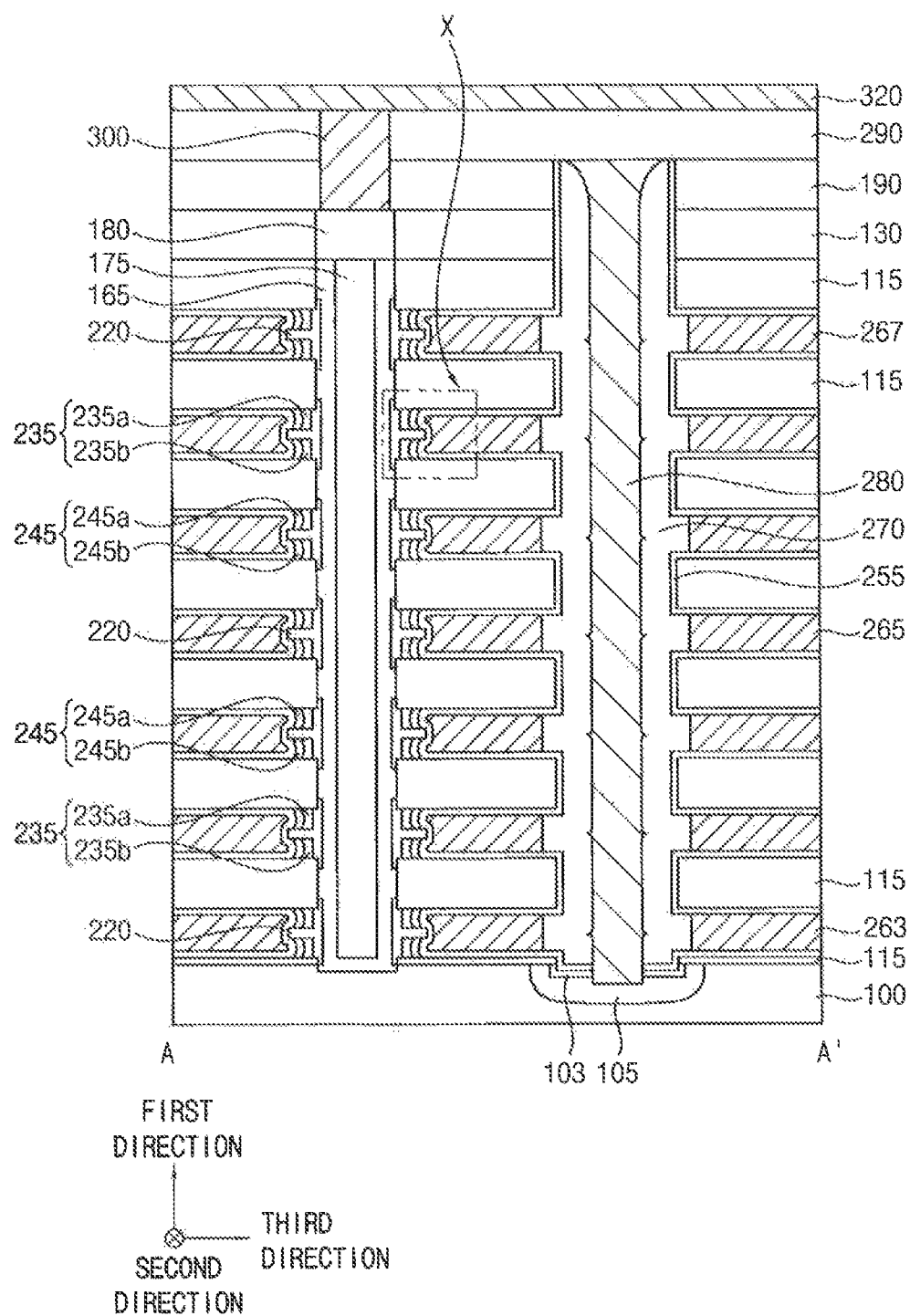
FIG. 2A is a cross-sectional view taken along line A-A' of FIG. 1 according to an exemplary embodiment of the present inventive concepts.
Figure 2B:
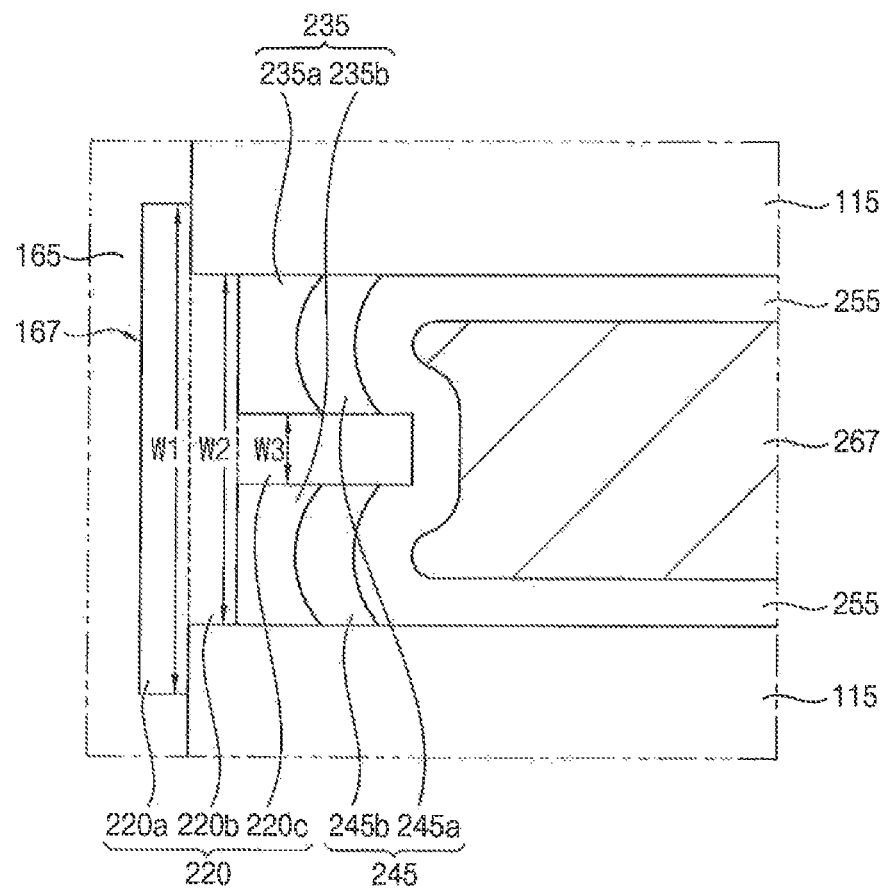
FIG. 2B is an enlarged view of region X shown in FIG. 2A according to an exemplary embodiment of the present inventive concepts.

FIG. 1 is a top plan view illustrating a vertical memory device in accordance with exemplary embodiments. FIG. 2 is a cross-sectional view taken along line A-A' of FIG. 1 according to an exemplary embodiment of the present inventive concepts. FIG. 2B is an enlarged view of region X shown in FIG. 2A according to an exemplary embodiment of the present inventive concepts.

Hereinafter, a vertical direction substantially perpendicular to an upper surface of a substrate is defined as a first direction, and two directions intersecting with each other among horizontal directions substantially parallel to the upper surface of the substrate are defined as second and third directions, respectively. In an exemplary embodiment, the second and third directions may be orthogonal to each other. However, exemplary embodiments of the present inventive concepts are not limited thereto.

Referring to FIGS. 1, 2A and 2B, the vertical memory device may include insulation patterns 115, gate electrodes, a channel 165, a tunnel insulation pattern 220, a charge trapping pattern structure 235, and a blocking pattern structure 245 on a substrate 100. Also, the vertical memory device may further include a buried pattern 175, a pad 180, a second blocking pattern 255, a spacer 270, a common source line (CSL) 280, first to fourth insulating interlayers 130, 190, 290 and 310, a contact plug 300, and a bit line 320.

In an exemplary embodiment, the substrate 100 may include silicon, germanium, silicon-germanium or III-V compounds such as GaP, GaAs, GaSb, etc. In some exemplary embodiments, the substrate 100 may be a silicon-on-insulator (SOI) substrate or a germanium-on-insulator (GOI) substrate.

The insulation patterns 115 may be formed on a plurality of levels along the first direction, and may be spaced apart from each other. The term "levels" refers to different distances from the substrate 100 in the first direction. The insulation patterns 115 may have different thicknesses along the first direction depending on the level of the insulation pattern. For example, a lowermost insulation pattern 115 formed on a first level from an upper surface of the substrate 100 (e.g., the closest insulation pattern in the first direction to the substrate) may have a thickness that is smaller than insulation patterns 115 on other levels. For example, in the exemplary embodiment shown in FIG. 2A, each of the insulation patterns 115 except for the insulation pattern 115 on the first level have substantially the same thickness as each other and such thickness is larger than the thickness of the insulation pattern on the first level.

Each of the gate electrodes may be formed between the insulation patterns 115, and thus may be formed on a plurality of levels to be spaced apart from each other (e.g., in the first direction). For example, in the exemplary embodiment shown in FIG. 2A, the insulation patterns 115 and the gate electrodes are alternately and repeatedly stacked in the first direction on the substrate 100. Each of the gate electrodes may extend in the second direction, and a plurality of gate electrodes may be arranged in the third direction. For example, as shown in the exemplary embodiment of FIG. 2A, each of the gate electrodes extending in the second direction may be spaced apart from each other in the third direction by the spacer 270 and the CSL 280 formed in an opening 200.

The gate electrodes may include first to third gate electrodes 263, 265 and 267 sequentially formed along the first direction. In an exemplary embodiment, the first gate electrode 263 may serve as a ground selection line (GSL), the second gate electrode 265 may serve as a word line, and the third gate electrode 267 may serve as a string selection line (SSL). Each of the first to third gate electrodes 263, 265 and 267 may be formed on one level or a plurality of levels. Additionally, in an exemplary embodiment, at least one dummy word line may be further formed between the first and second gate electrodes 263 and 265 and/or between the second and third gate electrodes 265 and 267.

As shown in the exemplary embodiment of FIG. 2A, the first gate electrode 263 may be formed on a lowermost level of electrodes that is closest to the substrate 100 in the first direction. The third gate electrode 267 may be formed on an uppermost level of electrodes that is farthest from the substrate 100 in the first direction and one level thereunder. The second gate electrode 265 may be formed on a plurality of levels between the first gate electrode 263 and the third gate electrode 267. For example, in the exemplary embodiment shown in FIG. 2A, the second gate electrode 265 may be formed on four levels between the first gate electrode 263 and the lowermost third gate electrode 267. However, exemplary embodiments of the present inventive concepts are not limited thereto. Each of the first to third gate electrodes 263, 265 and 267 may be formed adjacent to the channel 165 (e.g., in the third direction).

The first gate electrode 263 may include a first gate conductive pattern and a first gate barrier pattern covering upper and lower surfaces (e.g., in the first direction) and a portion of a sidewall of the first gate conductive pattern. The second gate electrode 265 may include a second gate conductive pattern and a second gate barrier pattern covering upper and lower surfaces (e.g., in the first direction) and a portion of a sidewall of the second gate conductive pattern. The third gate electrode 267 may include a third gate conductive pattern and a third gate barrier pattern covering upper and lower surfaces (e.g., in the first direction) and a portion of a sidewall of the third gate conductive pattern.

The upper surface, the lower surface and the sidewall adjacent to the channel 165 of each of the gate electrodes (e.g., an inner sidewall) may be covered by the second blocking pattern 255. The second blocking pattern 255 may also cover a portion of a sidewall of each of the insulation patterns 115, a sidewall of each of the first and second insulating interlayers 130 and 190, and a portion of the upper surface of the substrate 100. Further, the second blocking pattern 255 may cover a portion of an upper surface of an oxidation layer 103 formed on the substrate 100.

In an exemplary embodiment, the sidewall of each of the gate electrodes adjacent to the channel 165 may have a concave shape in the third direction.

As shown in the exemplary embodiment of FIG. 2A, the channel 165 may extend in the first direction on the upper surface of the substrate 100, and may extend through the insulation patterns 115, and the gate electrodes alternately and repeatedly stacked.

The buried pattern 175 may be formed to fill an inner space of the channel 165.

In an exemplary embodiment, the channel 165 may be formed to have a cup shape, and an inner space of the cup shape may be filled by the buried pattern 175 of a pillar shape. However, exemplary embodiments of the present inventive concepts are not limited thereto. For example, in an alternative embodiment, the channel 165 may have a pillar shape and a buried pattern 175 may not be formed.

A plurality of channels 165 may be formed in the second and third directions, and thus a channel array may be defined.

The tunnel insulation pattern 220 may be formed on an outer sidewall of the channel 165, and may include an oxide, such as silicon oxide, etc. However, exemplary embodiments of the present inventive concepts are not limited thereto. The tunnel insulation pattern 220 may include a protrusion portion that protrudes in a horizontal direction with respect to the upper surface of the substrate 100 (e.g., in the third direction) towards the gate electrodes.

In an exemplary embodiment of the present inventive concepts, the tunnel insulation pattern 220 may include first to third portions 220a, 220b and 220c sequentially stacked along the third direction from the outer sidewall of the channel 165 and having first to third widths W1, W2 and W3 in the first direction, respectively.

The first portion 220a of the tunnel insulation pattern may fill a second recess 167 that may be formed on the outer sidewall of the channel 165 adjacent to each of the gate electrodes in the third direction. An upper surface of the first portion 220a of the tunnel insulation pattern may be higher (e.g., in the first direction) than a lower surface of the insulation pattern 115 formed on each of the gate electrodes adjacent to the first portion 220a, and a lower surface of the first portion 220a of the tunnel insulation pattern may be lower (e.g., in the first direction) than an upper surface of the insulation pattern 115 formed under each of the gate electrodes adjacent to the first portion 220a.

The second portion 220b of the tunnel insulation pattern may be formed on an outer sidewall (e.g., the sidewall farthest from the channel 165) of the first portion 220a to cover the first portion 220a. The second portion 220b of the tunnel insulation pattern may extend toward each of the gate electrodes adjacent to the second portion 220b (e.g., in the third direction). An upper surface of the second portion 220b of the tunnel insulation pattern may contact a lower surface of the insulation pattern 115 formed on each of the gate electrodes adjacent to the second portion 220b, and a lower surface of the second portion 220b of the tunnel insulation pattern may contact an upper surface of the insulation pattern 115 formed under each of the gate electrodes adjacent to the second portion 220b.

The third portion 220c of the tunnel insulation pattern may be formed on an outer sidewall (e.g., the sidewall farthest from the channel) of the second portion 220b, and may protrude toward each of the gate electrodes in the third direction to form the protrusion portion. The upper surface of the third portion 220c of the tunnel insulation pattern may not contact a lower surface of the insulation pattern 115 formed on each of the gate electrodes adjacent to the third portion 220c and a lower surface of the third portion 220c of the tunnel insulation pattern may not contact an upper surface of the insulation pattern 115 formed under each of the gate electrodes adjacent to the third portion 220c. In an exemplary embodiment, the third portion 220c of the tunnel insulation pattern may be formed on a central portion of the second portion 220b (e.g., in the first direction). However, exemplary embodiments of the present inventive concepts are not limited thereto.

In an exemplary embodiment of the present inventive concepts, the first width W1 (e.g., length in the first direction) of the first portion 220a may be greater than the second width W2 of the second portion 220b. The second width W2 of the second portion 220b may be greater than the third width W3 of the third portion 220c. For example, the first to third widths W1, W2 and W3 of each of the first to third portions 220a, 220b and 220c may gradually decrease in this order.

In an exemplary embodiment of the present inventive concepts, the third portion 220c of the tunnel insulation pattern may be surrounded by the second portion 220b of the tunnel insulation pattern (e.g., on an inner sidewall), the charge trapping pattern structure 235 (e.g., on a portion of the upper and lower surfaces), the blocking pattern structure 245 (e.g., on a portion of the upper and lower surfaces) and the second blocking pattern 255 (e.g., on a portion of the upper and lower surfaces and on the outer sidewall).

In an exemplary embodiment, the tunnel insulation pattern 220 may include an oxide, such as silicon oxide, and a plurality of tunnel insulation patterns 220 may be formed to be spaced apart from each other in the first direction along the outer sidewall of the channel 165.

In an exemplary embodiment, the charge trapping pattern structure 235 may include a nitride, such as silicon nitride, etc. A plurality of charge trapping pattern structures 235 may be formed to be spaced apart from each other in the first direction, and each of the charge trapping pattern structure 235 may include upper and lower charge trapping patterns 235a and 235b spaced apart from each other in the first direction by the third portion 220c of the tunnel insulation pattern 220 (e.g., the protrusion portion).

In an exemplary embodiment of the present inventive concepts, an uppermost surface of the tunnel insulation pattern 220 (e.g., the top surface of the first portion 220a of the tunnel insulation pattern) may be higher than a top surface of the upper charge trapping pattern 235a. A lowermost surface of the tunnel insulation pattern 220 (e.g., the bottom surface of the first portion 220a of the tunnel insulation pattern) may be lower than a bottom surface of the lower charge trapping pattern 235b.

In an exemplary embodiment, each of the upper and lower charge trapping patterns 235a and 235b may have an outer sidewall (e.g., the sidewall farthest from the channel 165) having a concave shape along the third direction. However, exemplary embodiments of the present inventive concepts are not limited thereto. For example, each of the upper and lower charge trapping patterns 235a and 235b may include an outer sidewall having a vertical outer sidewall (e.g., extending in the first direction) with respect to the upper surface of the substrate 100, etc.

In an exemplary embodiment, the blocking pattern structure 245 may include an oxide, such as silicon oxide, etc. A plurality of blocking pattern structures 245 may be formed to be spaced apart from each other in the first direction, and each of the blocking pattern structures 245 include upper and lower first blocking patterns 245a and 245b spaced apart from each other in the first direction by the third portion 220c of the tunnel insulation pattern 220 (e.g., the protrusion portion).

In an exemplary embodiment of the present inventive concepts, the top surface of the first portion 220a of the tunnel insulation pattern may be higher (e.g., in the first direction) than a top surface of the upper first blocking pattern 245a. The bottom surface of the first portion 220a of the tunnel insulation pattern may be lower (e.g., in the first direction) than a bottom surface of the lower first blocking pattern 245b.

As shown in the exemplary embodiment of FIG. 2B, each of the top surfaces of the upper first blocking pattern 245a and the top surface of the upper charge trapping pattern 235a may be formed at the same height (e.g., distance in the first direction from the upper surface of the substrate 100) to contact the insulation patterns 115 formed thereon, and each of the bottom surface of the lower first blocking pattern 245b and the bottom surfaces of the lower charge trapping pattern 235b may also be formed at the same height to contact the insulation patterns 115 formed thereunder.

The first insulating interlayer 130 may be formed on the channel 165 and an uppermost insulation pattern 115, and the pad 180 may extend through the first insulating interlayer 130 to contact an upper surface of the channel 165. The second insulating interlayer 190 may be formed on the first insulating interlayer 130 and the pad 180. For example, a bottom surface of the second insulating interlayer 190 may be disposed directly on a top surface of the first insulating interlayer 130 and the pad 180 (e.g., in the first direction).

The spacer 270 may be formed on a sidewall of an opening 200 (shown in FIG. 8) extending through the insulation patterns 115 and the gate electrodes and exposing the upper surface of the substrate 100. The CSL 280 may fill a remaining portion of the opening 200.

The third insulating interlayer 290 may be formed on the second insulating interlayer 190, the CSL 280, the spacer 270 and the second blocking pattern 255. For example, as shown in the exemplary embodiment of FIG. 2A, a bottom surface of the third insulating interlayer 290 may be formed on top surfaces of the second insulating interlayer 190, the CSL 280, the spacer 270 and the second blocking pattern 255 (e.g., in the first direction).

The contact plug 300 may extend through the second and third insulating interlayers 190 and 290 to contact an upper surface of the pad 180.

The bit line 320 may extend through the fourth insulating interlayer 310 to contact an upper surface of the contact plug 300. For example, in an exemplary embodiment, the bit line 320 may extend in the third direction, and a plurality of bit lines may be arranged in the second direction.

As described above, the charge trapping pattern structure 235 formed between the gate electrodes and the channel 165 may include the upper and lower charge trapping patterns 235a and 235b spaced apart from each other along the first direction, so that electrons may be effectively injected through each of the upper and lower charge trapping patterns 235a and 235b, and thus the electrical characteristic of the vertical memory device may be improved.

Also, a plurality of charge trapping pattern structures 235 may be formed to be spaced apart from each other along the first direction, and each of the charge trapping pattern structures 235 may be separated by each of the insulation patterns 115. Accordingly, the interference of neighboring gate electrodes may be minimized, and the occurrence of coupling between the gate electrodes may be reduced.

FIGS. 3 to 15 are cross-sectional views illustrating stages of a method of manufacturing a vertical memory device in accordance with exemplary embodiments of the present inventive concepts. Specifically, FIGS. 3 to 9A and 10 to 15 are cross-sectional views taken along lines A-A' of FIG. 1. FIG. 9B is an enlarged cross-sectional view of FIG. 9A.

Figure 3:
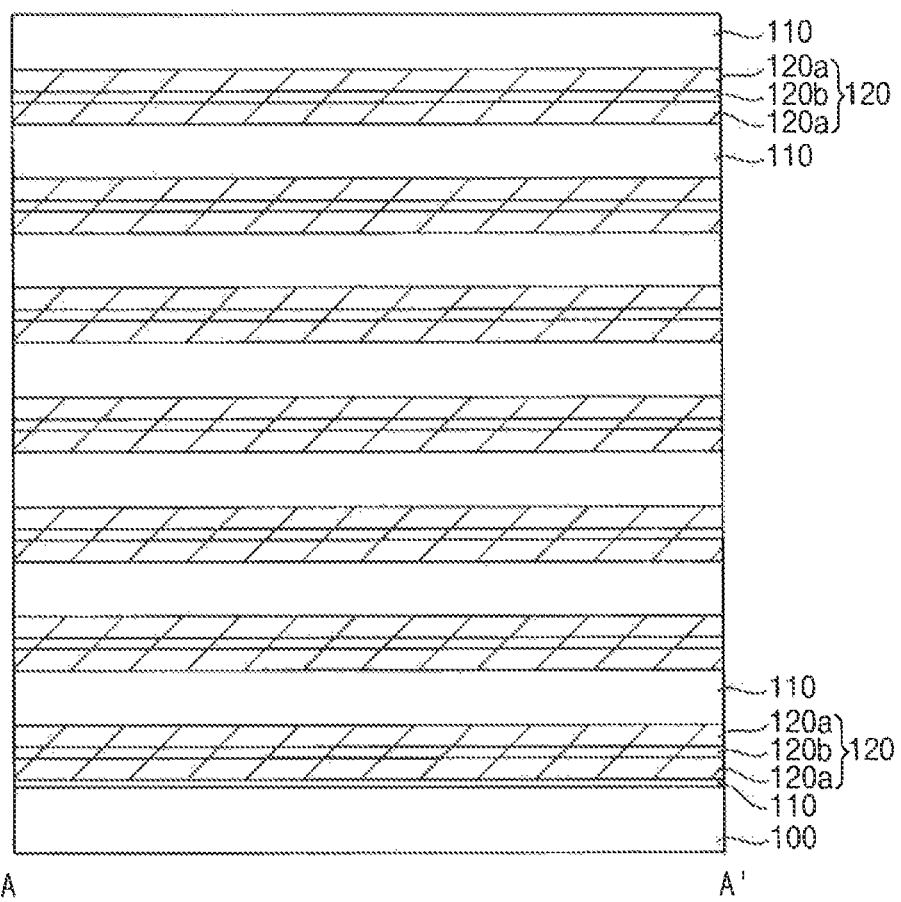

Referring to FIG. 3, an insulation layer 110 and a sacrificial layer structure 120 may be alternately and repeatedly stacked on a substrate 100 (e.g., in the first direction). Accordingly, a plurality of insulation layers 110 and a plurality of sacrificial layer structures 120 may be alternately stacked in the first direction. In the exemplary embodiment shown in FIG. 3, eight levels of insulation layers 110 and seven levels of sacrificial layer structures 120 are alternately formed on the substrate 100. However, the numbers of the insulation layer 110 and the sacrificial layer structure 120 are not limited thereto, and each of the insulation layer 110 and the sacrificial layer structure 120 may be formed in a greater number or a smaller number.

The sacrificial layer structure 120 may have a structure in which one second sacrificial layer 120b is formed between two first sacrificial layers 120a. For example, the first sacrificial layer 120a, the second sacrificial layer 120b and the first sacrificial layer 120a may be stacked sequentially to form one sacrificial layer structure 120. A top surface of the second sacrificial layer 120b may contact a bottom surface of an upper first sacrificial layer and a bottom surface of the second sacrificial layer may contact a top surface of a lower first sacrificial layer. In an exemplary embodiment, the thickness (e.g., length in the first direction) of the second sacrificial layer 120b may be smaller than the thickness of the first sacrificial layer 120a.

In an exemplary embodiment, the insulation layer 110 and the sacrificial layer structure 120 may be formed by a chemical vapor deposition (CVD) process, a plasma enhanced chemical vapor deposition (PECVD) process, an atomic layer deposition (ALD) process, etc. A lowermost insulation layer 110 formed directly on an upper surface of the substrate 100 may also be formed by a thermal oxidation process on the upper surface of the substrate 100.

The insulation layer 110 may include a silicon oxide, such as, PE-TEOS, HDP oxide PEOX, etc. The sacrificial layer structure 120 may include a material having an etching selectivity with respect to the insulation layer 110, such as silicon nitride.

In an exemplary embodiment, each of the first and second sacrificial layers 120a and 120b of the sacrificial layer structure 120 may have an etching selectivity with respect to each other.

For example, the first and second sacrificial layers 120a and 120b may include a silicon nitride, and the second sacrificial layer 120b may have a higher etching rate than the first sacrificial layer 120a for a specific etching solution or a specific etching gas. Accordingly, when an etching process using the etching solution or the etching gas is performed, the first sacrificial layer 120a may be etched to a lesser degree than the second sacrificial layer 120b.

Alternatively, in another exemplary embodiment the first and second sacrificial layers 120a and 120b may have different materials from each other. For example, the first and second sacrificial layers 120a and 120b may include silicon nitride and silicon oxynitride, respectively. In another exemplary embodiment, the first and second sacrificial layers 120a and 120b may also include silicon oxynitride and silicon nitride, respectively. Accordingly, when an etching process for removing the second sacrificial layer 120b is performed, the first sacrificial layer 120a may be etched to a lesser extent.

In an exemplary embodiment, a lowermost insulation layer 110 formed on a first level in the first direction from the upper surface of the substrate 100 among the insulation layers 110 may have a smaller thickness as compared with the insulation layer 110 at the other levels. In an exemplary embodiment, the insulation layers 110 except for the lowermost insulation layer 110 may have substantially the same thickness as each other.

Figure 4:
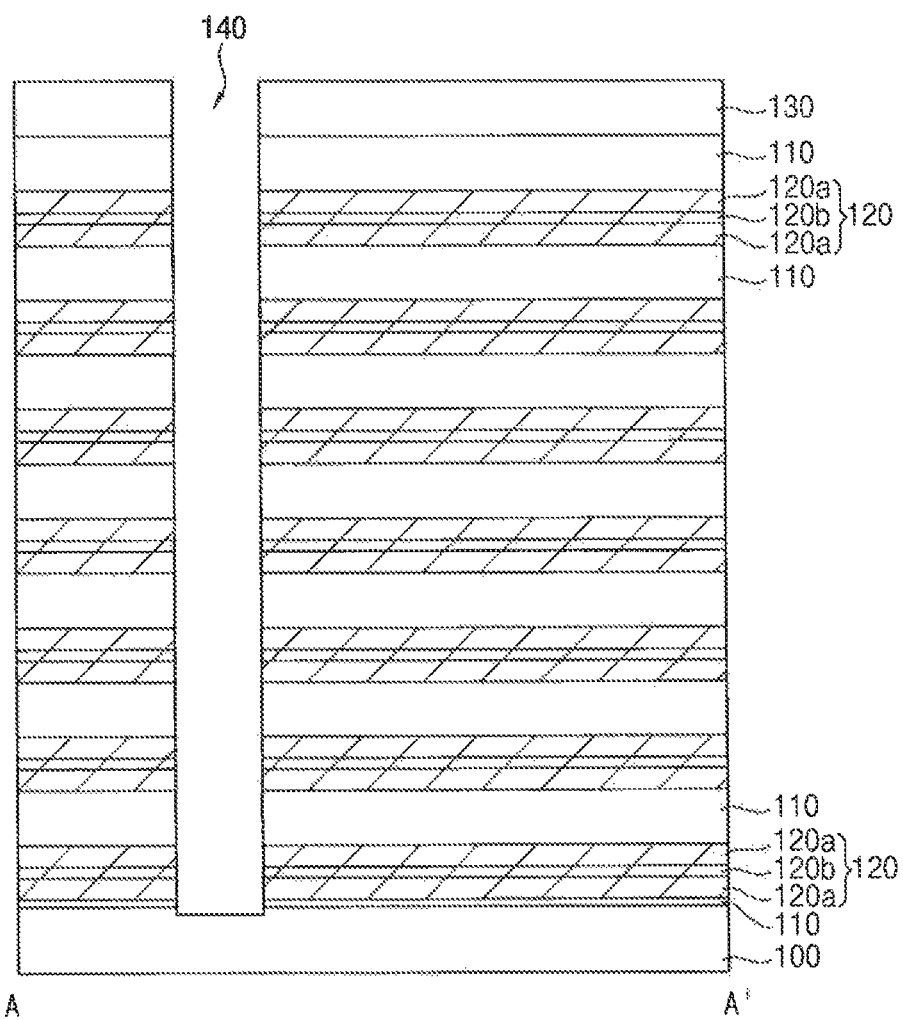

Referring to FIG. 4, a first insulating interlayer 130 is formed on an uppermost insulation layer 110. For example, as shown in the exemplary embodiment of FIG. 4, a bottom surface of the first insulating interlayer 130 may be formed directly on a top surface of the uppermost insulation layer 110. An etching process is subsequently performed using an etching mask to etch the first insulating interlayer 130, the insulation layers 110 and the sacrificial layers 120 thereunder, and a channel hole 140 extending through the first insulating interlayer 130, the insulation layers 110 and the sacrificial layers 120 may be formed to expose the upper surface of the substrate 100.

In an exemplary embodiment, the channel hole 140 may also partially extend through an upper portion of the substrate 100.

Figure 5:
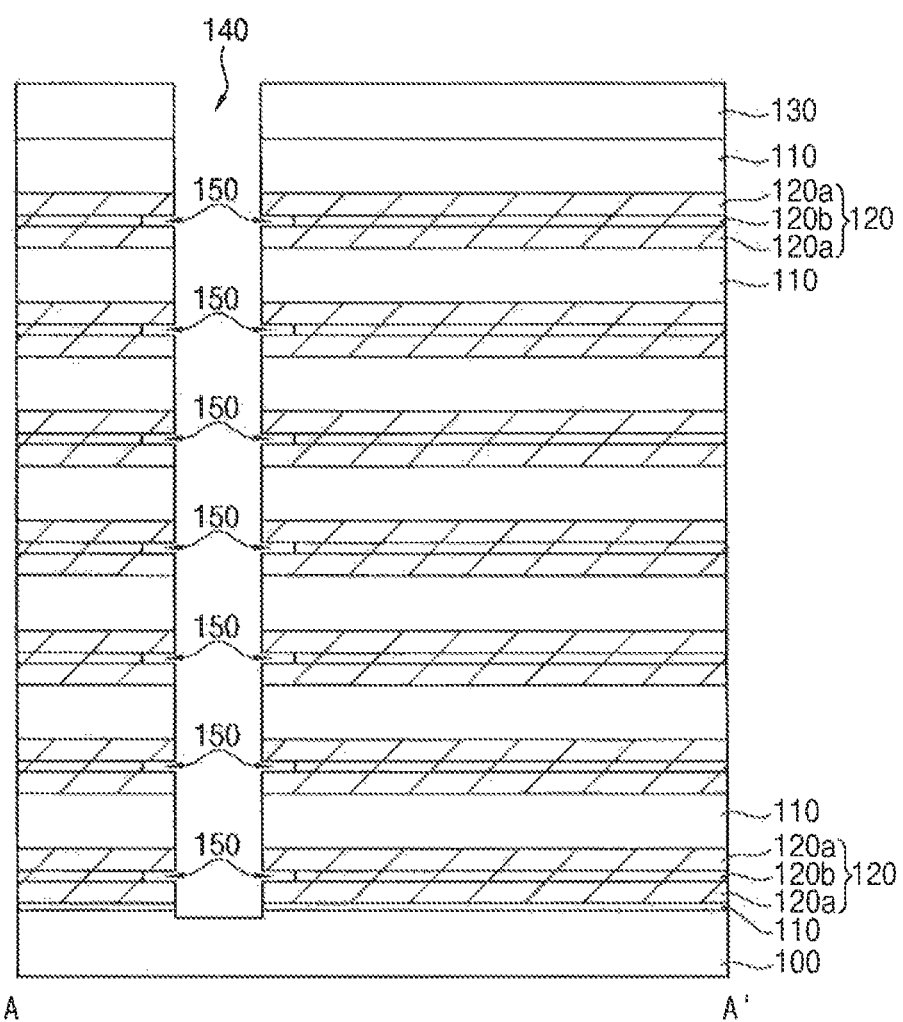

Referring to FIG. 5, a sidewall of the second sacrificial layer 120b of each of the sacrificial layer structures 120 exposed by the channel hole 140 may be partially removed to form first recesses 150 (e.g., extending in the third direction).

In an exemplary embodiment, each of the first recesses 150 may be formed by only partially removing each of the second sacrificial layers 120b, and the recess may have a constant depth in the third direction. Accordingly, the insulation layers 110 and the sacrificial layer structures 120 alternately and repeatedly stacked may have a concave-convex shape along the first direction as a whole.

The first and second sacrificial layers 120a and 120b may have the etching selectivity with respect to each other, so that the first sacrificial layer 120a is not removed when the first recesses 150 are formed.

In an exemplary embodiment, the first recesses 150 may be formed by a dry etching process or a wet etching process. However, exemplary embodiments of the present inventive concepts are no limited thereto.

Figure 6:
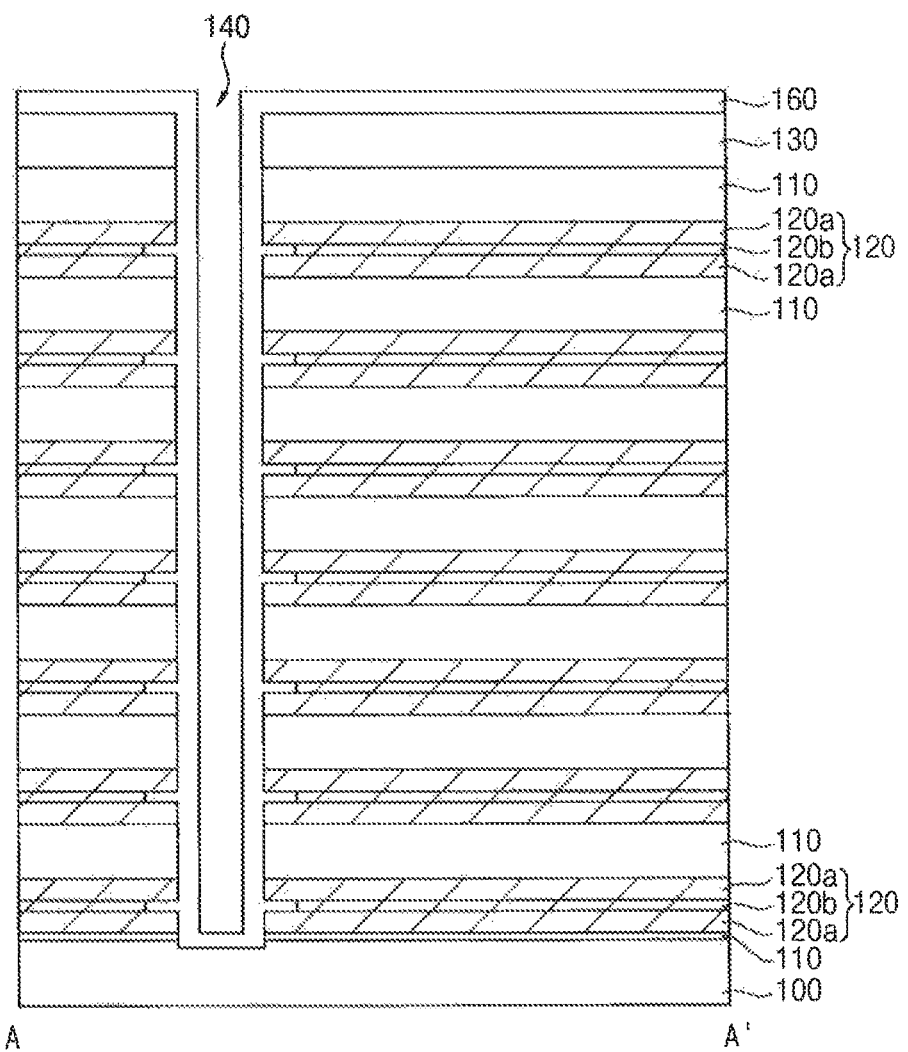
Figure 6:
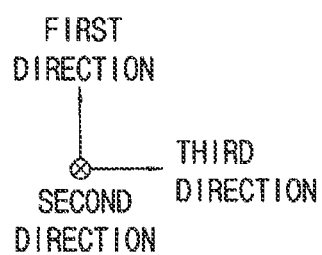

Referring to FIG. 6, a channel layer 160 may be formed on the exposed upper surface of the substrate 100, sidewalls of the insulation layers 110 and the sacrificial layer structures 120, the first recesses 150 and an upper surface of the first insulating interlayer 130.

The channel layer 160 may be formed to fill each of the first recesses 150, and a portion of an outer sidewall of the channel layer 160 adjacent to each of the second sacrificial layers 120b may protrude further than other portion of the outer sidewall thereof in a horizontal direction (e.g., in the third direction) to form a protrusion portion. Accordingly, the outer sidewall of the channel layer 160 may have a concave-convex shape along the first direction as a whole.

In an exemplary embodiment, the channel layer 160 may include polysilicon doped or undoped with impurities, or amorphous silicon. In exemplary embodiments in which the channel layer 160 includes amorphous silicon, a laser epitaxial growth (LEG) process or a solid phase epitaxy (SPE) process may be further performed to convert amorphous silicon into crystalline silicon.

Figure 7:
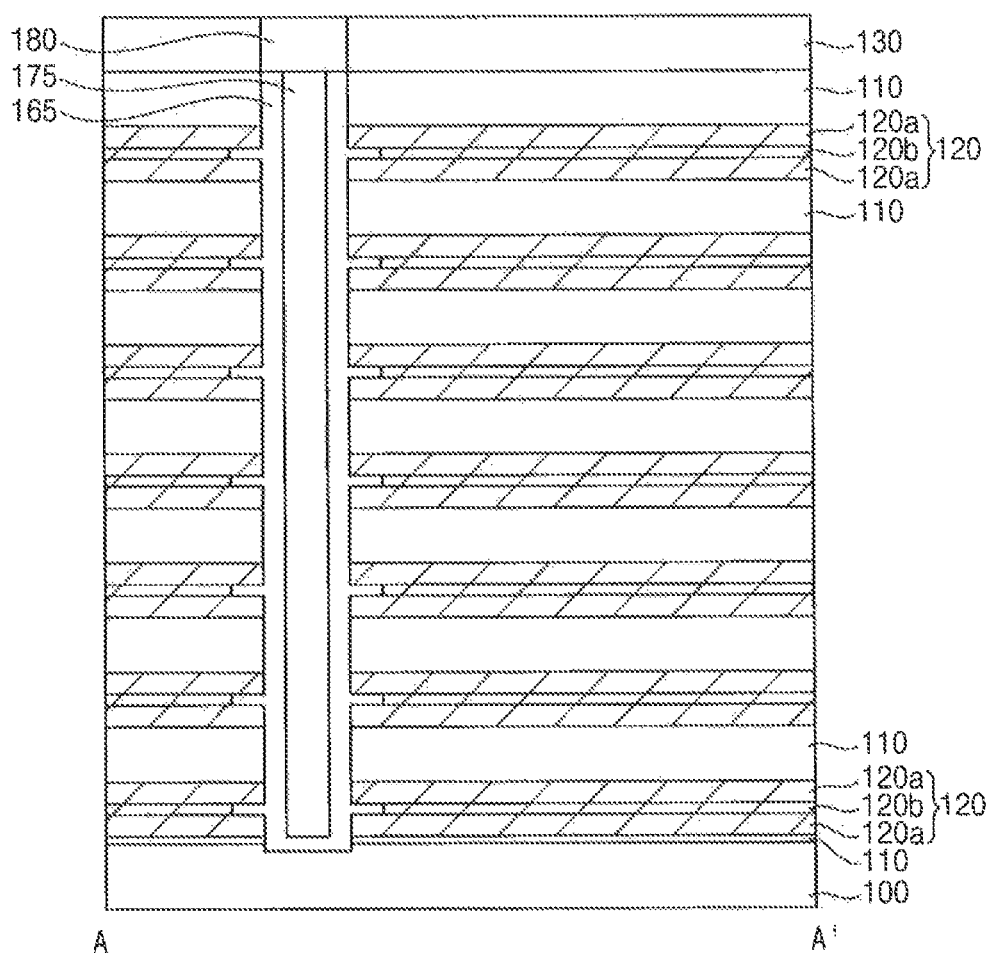

Referring to FIG. 7, a buried layer may be formed on the channel layer 160 to efficiently fill a remaining portion of the channel hole 140. The buried layer and the channel layer 160 may then be planarized until the upper surface of the first insulating interlayer 130 may be exposed, and a buried pattern 175 and a channel 165 may be formed to fill the channel hole 140.

In an exemplary embodiment, the channel 165 may have a cup shape, and the buried pattern 175 may have a pillar shape.

A plurality of channels 165 may be formed along the second and third directions to form a channel array.

In an exemplary embodiment, the buried pattern 175 may include an oxide, such as silicon oxide, etc.

Upper portions of each of the buried pattern 175 and the channel 165 may be removed to form a trench and a pad 180 may be formed to fill the trench.

For example, after removing each of the upper portions of the buried pattern 175 and the channel 165 to form the trench, a pad layer filling the trench may be formed on the buried pattern 175, the channel 165 and the first insulating interlayer 130. An upper portion of the pad layer may then be planarized until the upper surface of the first insulating interlayer 130 may be exposed to form the pad 180. In an exemplary embodiment, the pad layer may include polysilicon doped with impurities or amorphous silicon. However, exemplary embodiments of the present inventive concepts are not limited thereto. In exemplary embodiments in which the pad layer includes amorphous silicon, a process for crystallizing the pad layer may be further performed.

Figure 8:
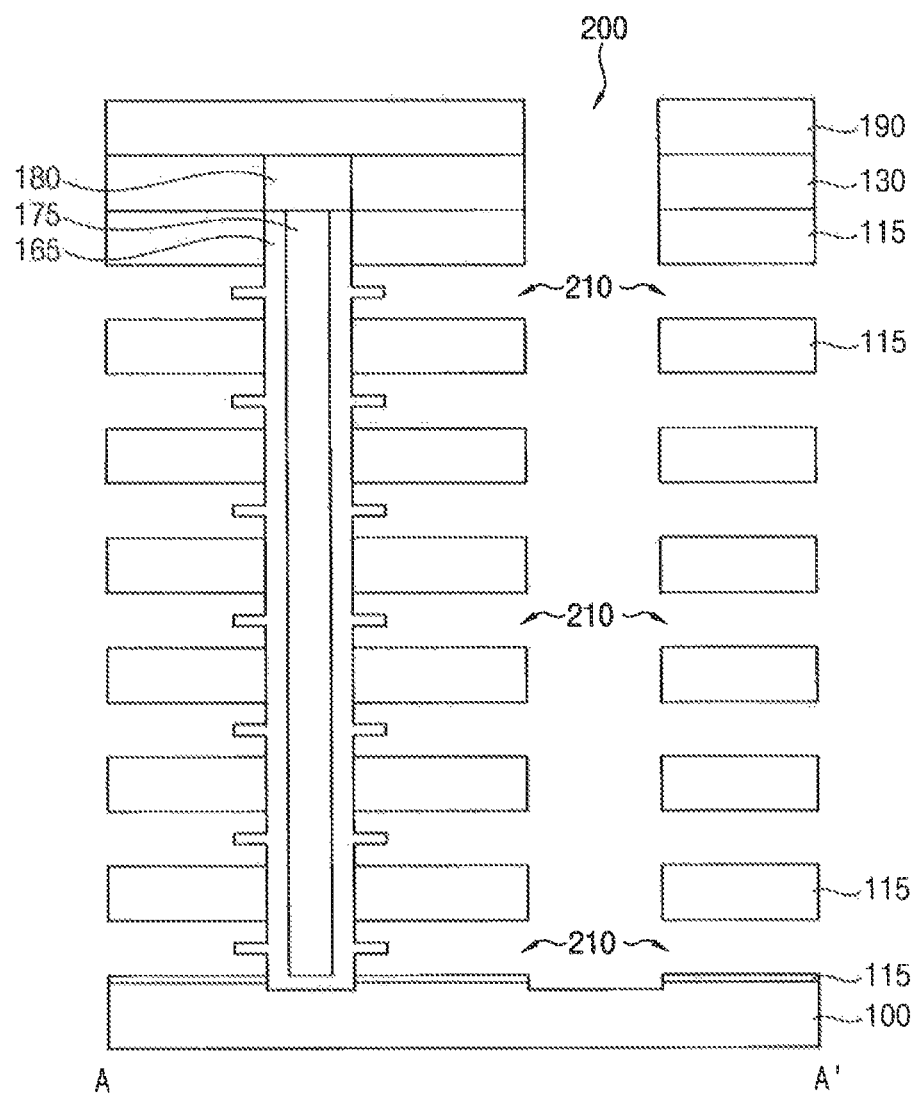

Referring to FIG. 8, a second insulating interlayer 190 is formed on the first insulating interlayer 130 and the pad 180. For example, as shown in the exemplary embodiment of FIG. 8, a bottom surface of the second insulating interlayer 190 may directly contact a top surface of the first insulating interlayer 130. An opening 200 extending through the first and second insulating interlayers 130 and 190, the insulation layers 110, and the sacrificial layer structures 120 may then be formed to expose the upper surface of the substrate 100 by performing an etching process using an etching mask.

In an exemplary embodiment, the opening 200 may extend in the second direction, and a plurality of openings 200 may be formed along the third direction.

As the opening 200 is formed, the insulation layer 110 may be converted into an insulation pattern 115, and the sacrificial layer structure 120 may be converted into a sacrificial pattern structure.

The sacrificial pattern structures exposed by the opening 200 may be removed to form a gap 210 between the insulation patterns 115 of each level, and a portion of the outer sidewall of channel 165 may be exposed by the gap 210. In an exemplary embodiment, the sacrificial pattern structures exposed by the opening 200 may be removed by a wet etching process using an etchant including phosphoric acid or sulfuric acid.

The portion of the outer sidewall of the channel 165 exposed by the gap 210 may include the protrusion portion that protrudes in the third direction.

Figure 9A:
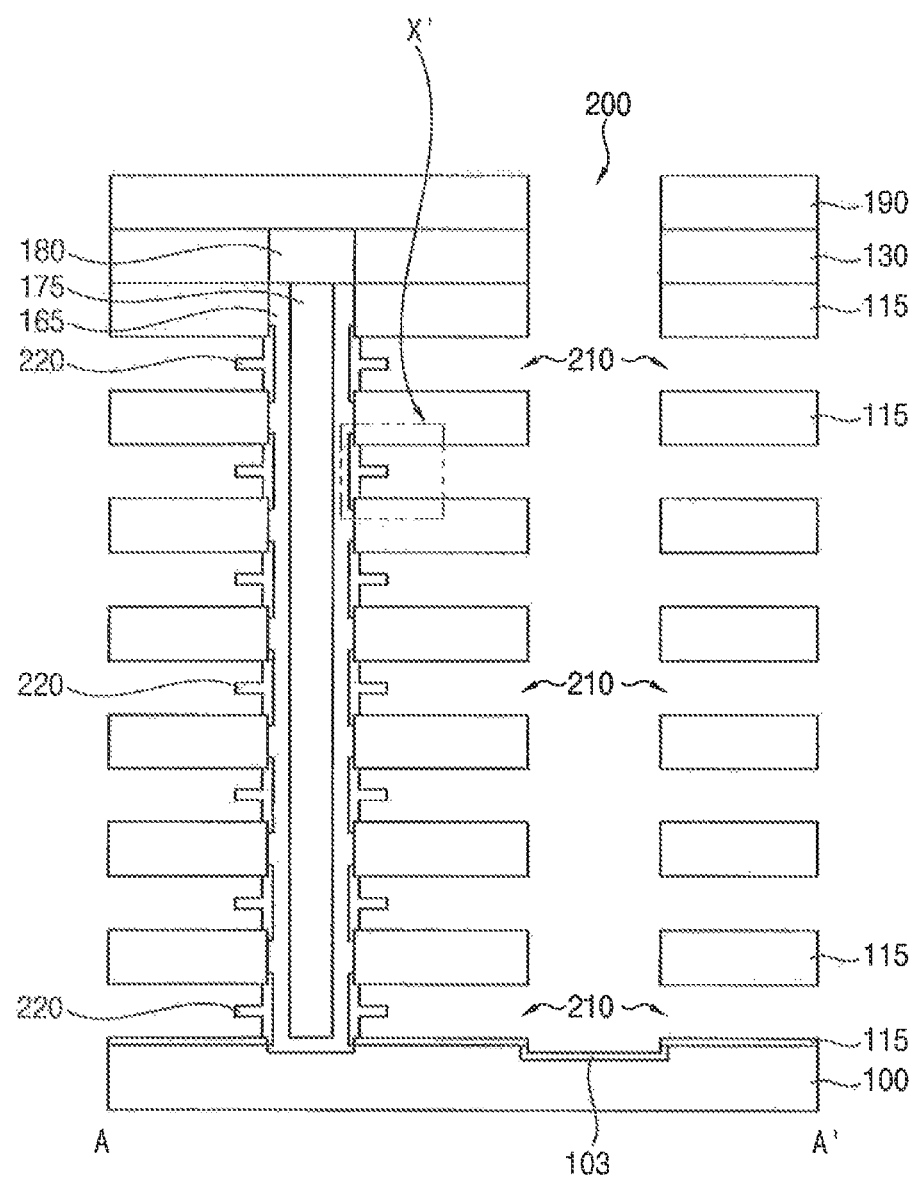
Figure 9B:
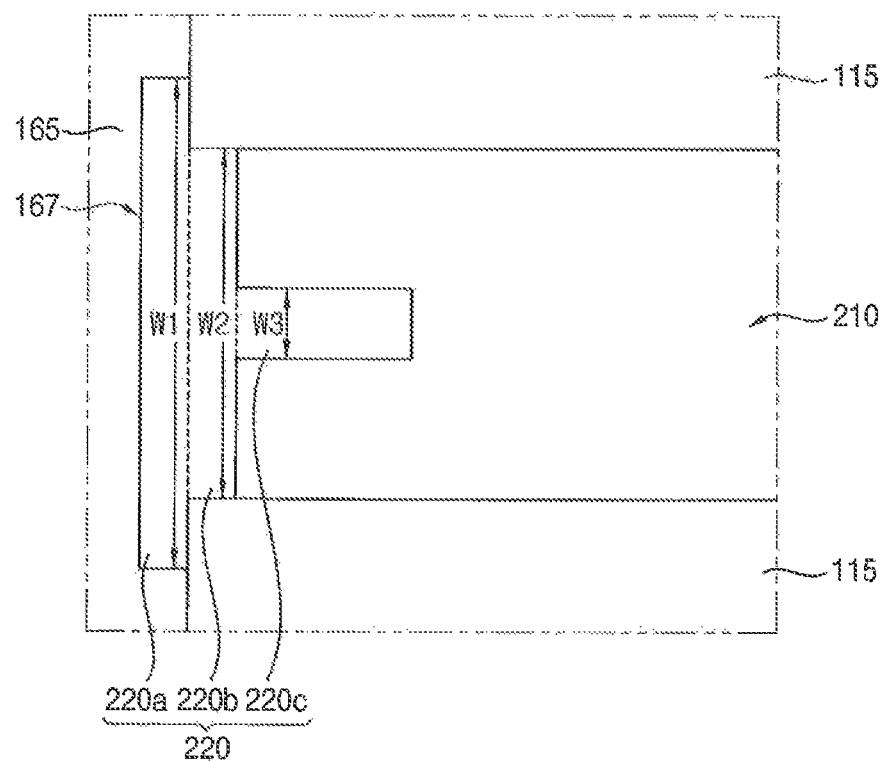
FIG. 9B is an enlarged view of region X' shown in FIG. 9A according to an exemplary embodiment of the present inventive concepts.

Referring to FIG. 9A, an oxidation process may be performed on the portion of the outer sidewall of the channel 165 exposed by the gap 210 to form a tunnel insulation pattern 220 on the outer sidewall of the channel 165.

The tunnel insulation pattern 220 may be formed by the oxidation of the portion of the outer sidewall of the channel exposed by the gap 210, and thus may include a protrusion portion that protrudes in the third direction.

Also, a portion of the channel 165 is converted into the tunnel insulation pattern 220 when the oxidation process is performed. The portion of the channel adjacent to the tunnel insulation pattern 220 in the third direction may have a smaller thickness (e.g., length in the third direction) than other portions of the channel 165. Accordingly, the channel 165 may have a thickness (e.g., length in the third direction) that is not constant along the first direction.

In an exemplary embodiment, the tunnel insulation pattern 220 may include an oxide, such as silicon oxide, and a plurality of tunnel insulation patterns 220 may be formed to be spaced apart from each other along the outer sidewall of the channel 165 in the first direction.

In an exemplary embodiment, the tunnel insulation pattern 220 may have a flat upper surface and a flat lower surface, and may have an inner wall substantially vertical to the upper surface of the substrate 100 (e.g., extending in the first direction).

A portion of the upper surface of the substrate 100 exposed by the opening 200 may also be oxidized by the oxidation process to form an oxidation layer 103. In an exemplary embodiment, the oxidation layer 103 may include an oxide, such as silicon oxide.

Referring to FIG. 9B, the tunnel insulation pattern 220 may include first to third portions 220a, 220b and 220c sequentially stacked along the third direction from the outer sidewall of the channel 165 and having first to third widths W1, W2 and W3 in the first direction, respectively. For example, an inner sidewall of the first portion 220a (e.g., the sidewall closest to the channel 165) may directly contact the outer sidewall of the channel. The outer sidewall of the first portion 220a may directly contact an inner sidewall of the second portion 220b. The outer sidewall of the second portion may directly contact an inner sidewall of the third portion 220c.

The first portion 220a of the tunnel insulation pattern may fill a second recess 167 that may be formed on the outer sidewall of the channel 165 adjacent the gap 210 in the third direction. An upper surface (e.g., in the first direction) of the first portion 220a of the tunnel insulation pattern may be higher than a lower surface (e.g., in the first direction) of the insulation pattern 115 formed below the gap 210. A lower surface of the first portion 220a of the tunnel insulation pattern may be lower (e.g., in the first direction) than an upper surface of the insulation pattern 115 formed below the gap 210.

The second portion 220b of the tunnel insulation pattern may be formed on an outer sidewall of the first portion 220a to cover the first portion 220a, and may extend toward the gap 210 in the third direction. An upper surface of the second portion 220b of the tunnel insulation pattern may contact a lower surface of the insulation pattern 115 formed above the gap 210. A lower surface of the second portion 220b of the tunnel insulation pattern may contact an upper surface of the insulation pattern 115 formed below the gap 210.

The third portion 220c of the tunnel insulation pattern may be formed on an outer sidewall of the second portion 220b (e.g., the sidewall farthest from the channel 165), and may protrude within the gap 210 to form the protrusion portion. However, the upper surface of the third portion 220c of the tunnel insulation pattern may not contact a lower surface of the insulation pattern 115 formed above the gap 210 and a lower surface of the third portion 220c of the tunnel insulation pattern may not contact an upper surface of the insulation pattern 115 formed below the gap 210. In an exemplary embodiment, the third portion 220c of the tunnel insulation pattern may be formed on a central portion of the second portion 220b (e.g., in the first direction).

In the exemplary embodiment shown in FIG. 9B, the first width W1 of the first portion 220a (e.g., length in the first direction) may be greater than the second width W2 of the second portion 220b, and the second width W2 of the second portion 220b may be greater than the third width W3 of the third portion 220c. Therefore, the first to third widths W1, W2 and W3 of each of the first to third portions 220a, 220b and 220c may gradually decrease in this order.

In an exemplary embodiment, the first portion 220a may have a thickness (e.g., length in the third direction) greater than the thickness of the second portion 220b, but smaller than the thickness of the third portion 220c. For example, the third portion 220c may have the greatest thickness in the third direction, and the second portion 220b may have the smallest thickness in the third direction.

Figure 10:
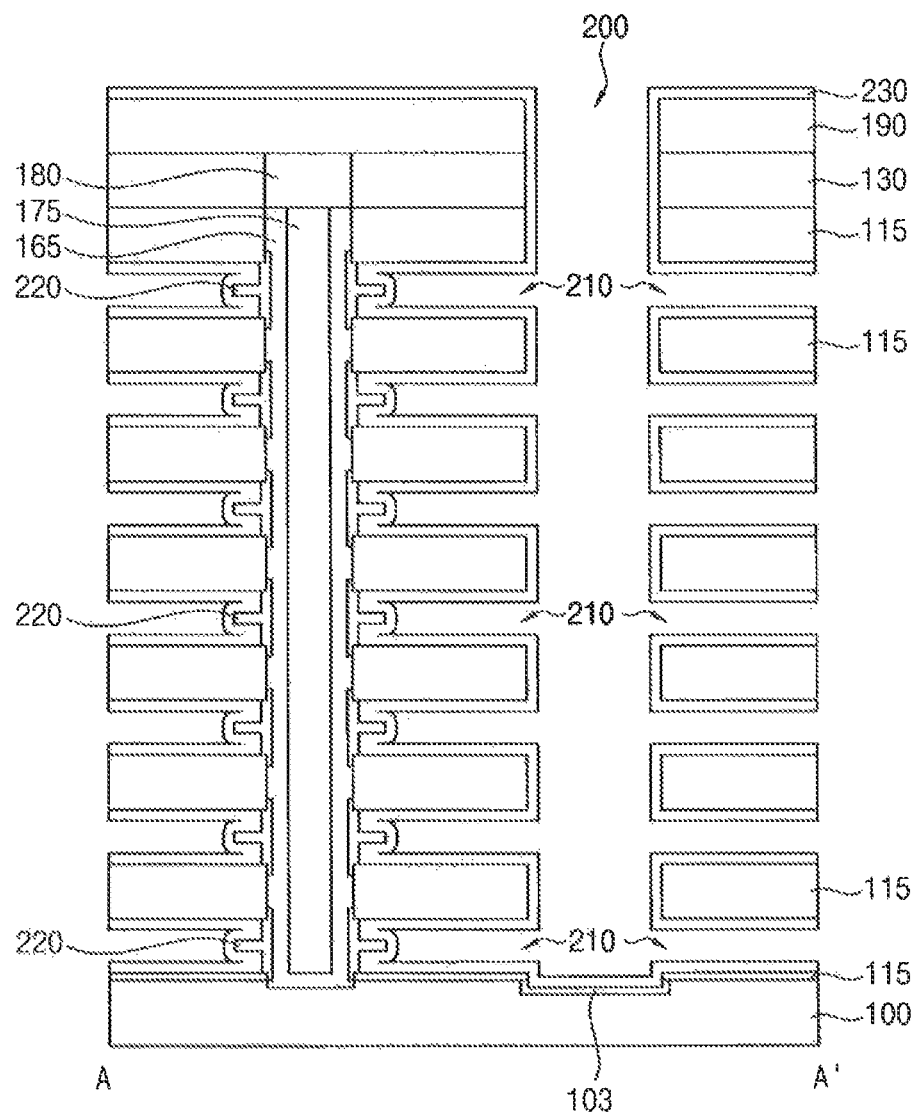
Figure 10:
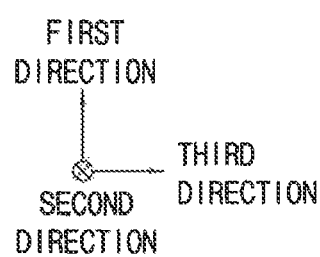
Figure 11:
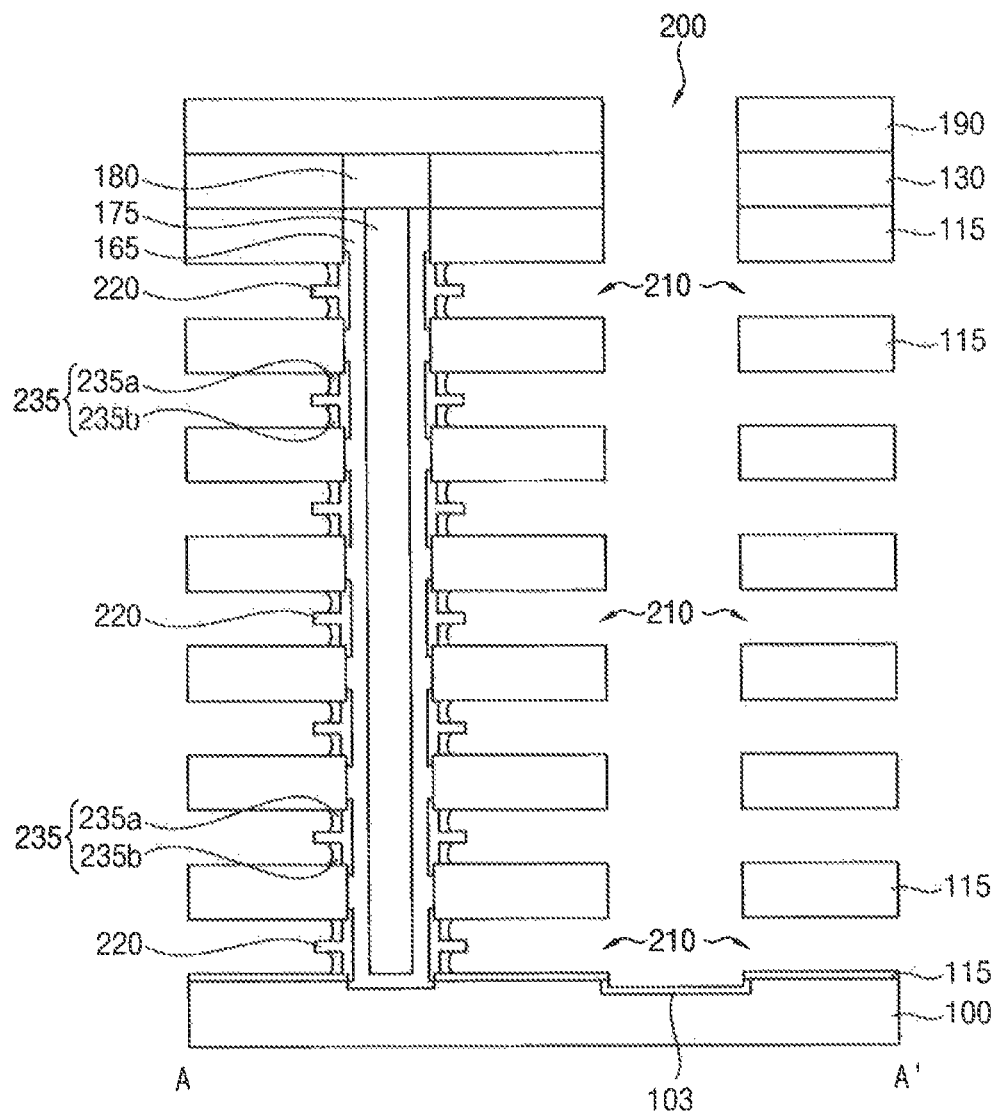

Referring to FIG. 10, a charge trapping layer 230 is conformally formed on the outer sidewall of the tunnel insulation pattern 220, the upper surface, the lower surface and the sidewall of each of the insulation patterns 115, the oxidation layer 103, and surfaces of each of the first and second insulating interlayers 130 and 190. The charge trapping layer 230 may then be partially removed to form a charge trapping pattern structure 235 as shown in FIG. 11. In an exemplary embodiment, the charge trapping layer 230 may include a nitride, such as silicon nitride.

In an exemplary embodiment, the charge trapping layer 230 may be formed by a chemical vapor deposition (CVD) process, a plasma enhanced chemical vapor deposition (PECVD) process, an atomic layer deposition (ALD) process, etc. The charge trapping layer 230 may have a uniform thickness as a whole. However, as the outer sidewall of the tunnel insulation pattern 220 may include the protrusion portion protruding in the third direction, a portion of the charge trapping layer 230 formed between the third portion 220c of the tunnel insulation pattern and each of the insulation patterns 115 may have a greater thickness than other portion thereof.

Referring to FIG. 11, in an exemplary embodiment, a wet etching process may be performed on the charge trapping layer 230.

The charge trapping layer 230 may have the uniform thickness as a whole, and most of the charge trapping layer 230 may be removed. However, the portion of the charge trapping layer 230 formed between the third portion 220c of the tunnel insulation pattern and each of the insulation patterns 115 which has a greater thickness may not completely removed even after the etching process, and may remain to form a charge trapping pattern structure 235.

A plurality of charge trapping pattern structures 235 may be formed to be spaced apart from each other in the first direction, and each of the charge trapping pattern structures 235 may include upper and lower charge trapping patterns 235a and 235b spaced apart from each other in the first direction by the third portion 220c of the tunnel insulation pattern 220 (e.g., the protrusion portion).

In an exemplary embodiment, the top surface of the first portion 220a of the tunnel insulation pattern 220 (e.g., an uppermost surface of the tunnel insulating pattern) may be higher than an upper surface of the upper charge trapping pattern 235a, and the bottom surface of the first portion 220a of the tunnel insulation pattern (e.g., the lowermost surface of the tunnel insulation pattern) may be lower than a bottom surface of the lower charge trapping pattern 235b.

In an exemplary embodiment, each of the upper and lower charge trapping patterns 235a and 235b may have an outer sidewall (e.g., the sidewall farthest from the channel 165) of a concave shape along the third direction. However, exemplary embodiments of the present inventive concepts are not limited thereto. For example, each of the upper and lower charge trapping patterns 235*a* and 235*b* may have an outer sidewall of a concave shape along the third direction, or may have a vertical outer sidewall with respect to the upper surface of the substrate 100.

Figure 12:
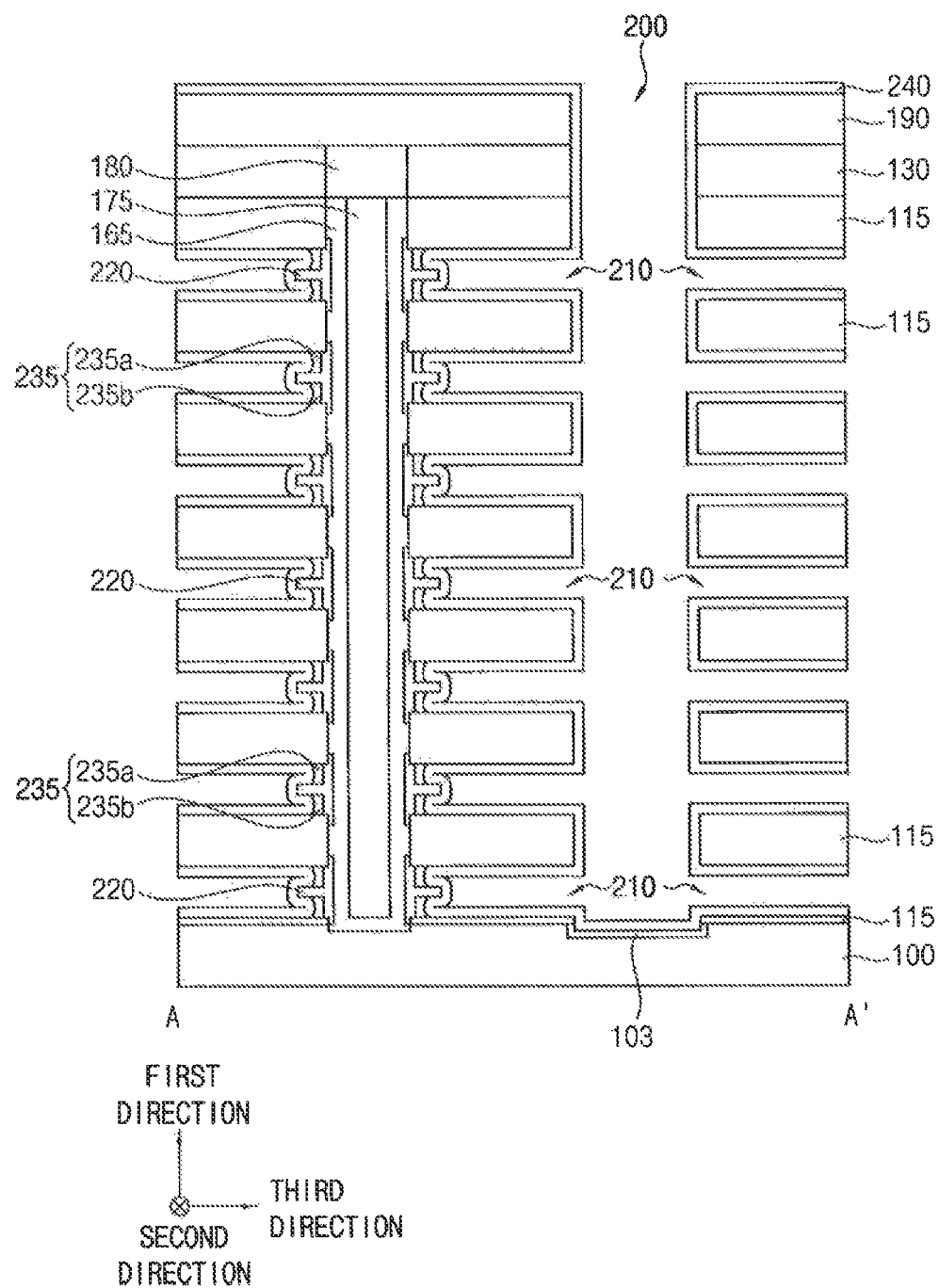

Referring to FIG. 12, a first blocking layer 240 may be conformally formed on the outer sidewall of the tunnel insulation pattern 220, an outer sidewall of the charge trapping pattern structure 235, the upper surface, the lower surface and the sidewall of each of the insulation patterns 115, the oxidation layer 103, and the surfaces of the first and second insulating interlayers 130 and 190 exposed by the opening 200 and the gap 210.

In an exemplary embodiment, the first blocking layer 240 may include an oxide, such as silicon oxide, etc. However, exemplary embodiments of the present inventive concepts are not limited thereto.

Figure 13:
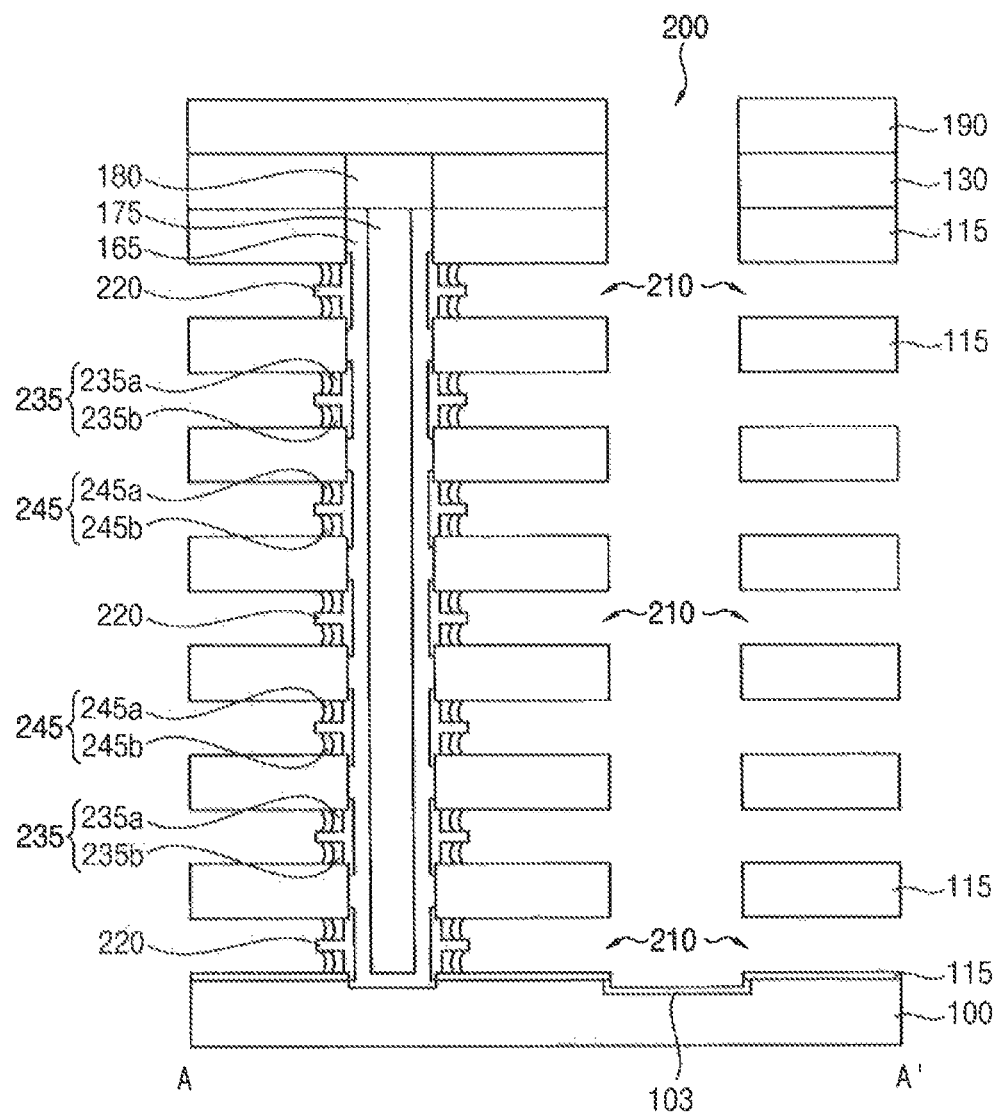

Referring to FIG. 13, an etching process, such as a wet etching process may be performed on the first blocking layer 240 to form a blocking pattern structure 245.

A plurality of blocking pattern structures 245 may be formed to be spaced apart from each other in the first direction, and each of the blocking pattern structures 245 may include upper and lower first blocking patterns 245*a* and 245*b* spaced apart from each other in the first direction by the third portion 220*c* of the tunnel insulation pattern (e.g., the protrusion portion).

In an exemplary embodiment, the top surface of the first portion 220*a* of the tunnel insulation pattern may be higher (e.g., in the first direction) than a top surface of the upper first blocking pattern 245*a*, and the bottom surface of the first portion 220*a* of the tunnel insulation pattern may be lower (e.g., in the first direction) than a bottom surface of the lower first blocking pattern 245*b*.

In an exemplary embodiment, each of the upper surface of the upper first blocking pattern 245*a* and the upper surface of the upper charge trapping pattern 235*a* may be formed at the same height (e.g., distance from the upper surface of the substrate 100 in the first direction) to contact the insulation patterns 115 formed thereon. Each of the lower surface of the lower first blocking pattern 245*b* and the lower surface of the lower charge trapping pattern 235*b* may also be formed at the same height to contact the insulation patterns 115 formed thereunder.

As shown in the exemplary embodiment of FIG. 13, each of the upper and lower first blocking patterns 245*a* and 245*b* may have an outer sidewall of a concave shape along the third direction.

Figure 14:
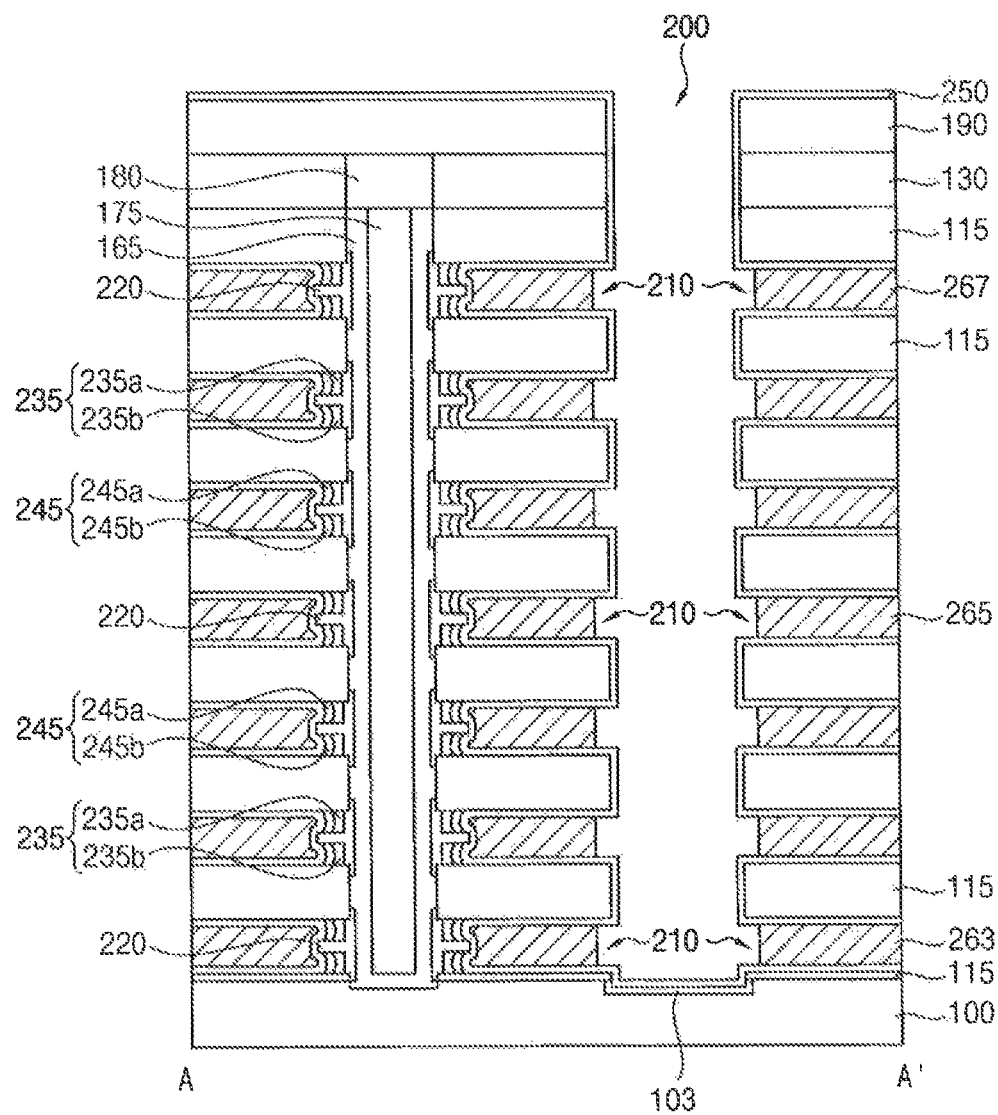

Referring to FIG. 14, a second blocking layer 250 may be conformally formed on the outer sidewall of the tunnel insulation pattern 220, the outer sidewall of the blocking pattern structure 245, an outer sidewall of the charge trapping pattern structure 235, the upper surface, the lower surface and the sidewall of each of the insulation patterns 115, the oxidation layer 103, and the surfaces of the first and second insulating interlayers 130 and 190 exposed by the opening 200 and the gap 210. A gate electrode layer may be subsequently formed on the second blocking layer 250 to efficiently fill a remaining portion of the gap 210.

In an exemplary embodiment, the second blocking layer 250 may include a metal oxide, such as aluminum oxide, hafnium oxide, zirconium oxide, etc. However, exemplary embodiments of the present inventive concepts are not limited thereto.

The gate electrode layer may include agate barrier layer and agate conductive layer sequentially stacked. In an exemplary embodiment, the gate conductive layer may include a metal having low electrical resistance, such as tungsten, titanium, tantalum, platinum, etc. The gate barrier layer may include a metal nitride, such as titanium nitride, tantalum nitride, etc.

The gate electrode layer may be partially removed to form a gate conductive pattern and a gate barrier pattern in the gap 210, and the gate conductive pattern and the gate barrier pattern altogether may form a gate electrode. In an exemplary embodiment, the gate conductive pattern and the gate barrier pattern may be removed by a wet etching process.

The gate electrode may extend in the second direction, and a plurality of gate electrodes may be formed along the third direction. Each of the gate electrodes extending in the second direction may be spaced apart from each other in the third direction by the opening 200.

The gate electrodes may include first to third gate electrodes 263, 265 and 267 sequentially formed along the first direction. The first gate electrode 263 may serve as a ground selection line (GSL), the second gate electrode 265 may serve as a word line, and the third gate electrode 267 may serve as a string selection line (SSL). Each of the first to third gate electrodes 263, 265 and 267 may be formed on one level or a plurality of levels. Also, at least one dummy word line may be further formed between the first and second gate electrodes 263 and 265 and/or between the second and third gate electrodes 265 and 267.

In an exemplary embodiment, the first gate electrode 263 may be formed on a first level (e.g., the lowermost level in the first direction), the third gate electrode 267 may be formed on an uppermost level and one level thereunder, and the second gate electrode 265 may be formed on a plurality of levels between the first gate electrode 263 and the third gate electrode 267.

The first gate electrode 263 may include a first gate conductive pattern and a first gate barrier pattern covering upper and lower surfaces and a portion of a sidewall of the first gate conductive pattern, the second gate electrode 265 may include a second gate conductive pattern and a second gate barrier pattern covering upper and lower surfaces and a portion of a sidewall of the second gate conductive pattern, and the third gate electrode 267 may include a third gate conductive pattern and a third gate barrier pattern covering upper and lower surfaces and a portion of a sidewall of the third gate conductive pattern.

A top surface of the first portion 220*a* of the tunnel insulation pattern may be higher than a bottom surface of the insulation pattern 115 formed on each of the gate electrodes adjacent to the first portion 220*a*, and a bottom surface of the first portion 220*a* of the tunnel insulation pattern may be lower than a top surface of the insulation pattern 115 formed under each of the gate electrodes adjacent to the first portion 220*a*. A top surface of the second portion 220*b* of the tunnel insulation pattern may contact a bottom surface of the insulation pattern 115 formed on each of the gate electrodes adjacent to the second portion 220*b*, and a bottom surface of the second portion 220*b* of the tunnel insulation pattern may contact a top surface of the insulation pattern 115 formed under each of the gate electrodes adjacent to the second portion 220*b*. An upper surface of the third portion 220*c* of the tunnel insulation pattern may not contact a lower surface of the insulation pattern 115 formed on each of the gate electrodes adjacent to the third portion 220*c* and a bottom surface of the third portion 220*c* of the tunnel insulation pattern may not contact a top surface of the insulation pattern 115 formed under each of the gate electrodes adjacent to the third portion 220c.

In an exemplary embodiment, an inner sidewall of each of the gate electrodes adjacent to the channel 165 may have a concave shape along the third direction.

Figure 15:
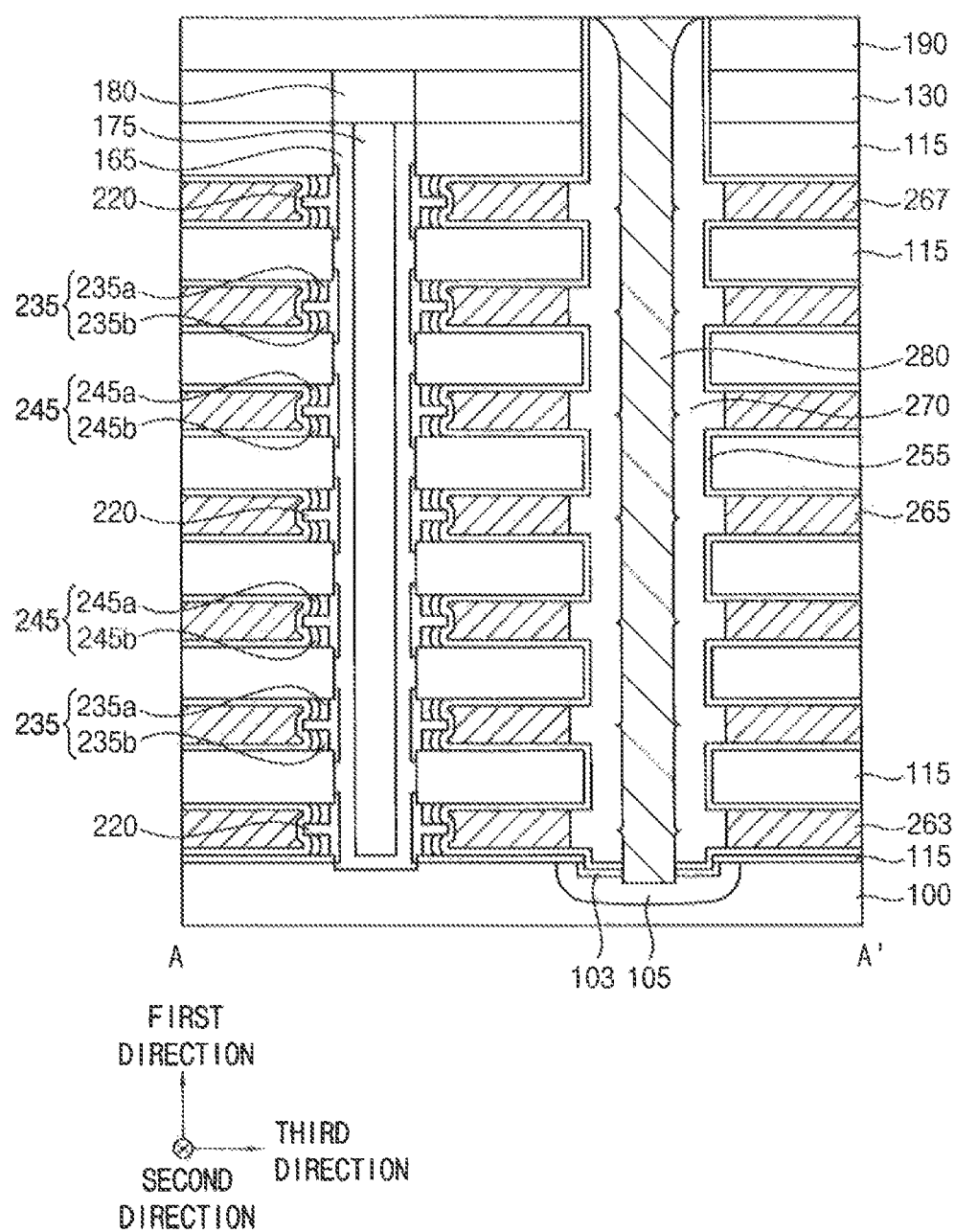

Referring to FIG. 15, impurities may be injected into the exposed upper portion of the substrate 100 formed under the oxidation layer 103 to form an impurity region 105. A spacer layer may be formed on an upper surface of the impurity region 105, a sidewall of the opening 200 and an upper surface of the second insulating interlayer 190. The spacer layer may be anisotropically etched to form a spacer 270 on the sidewall of the opening 200. Therefore, the impurity region 105 on the upper portion of the substrate 100 may be partially exposed.

In an exemplary embodiment, the impurities may include n-type impurities, such as phosphorous, arsenic, etc., and the second spacer layer may include an oxide, such as silicon oxide. However, exemplary embodiments of the present inventive concepts are not limited thereto.

A common source line (CSL) 280 may be formed on the exposed impurity region 105 to fill a remaining portion of the opening 200.

In an exemplary embodiment, the CSL 280 may be formed by forming a conductive layer on the exposed impurity region 105, the spacer 270 and the second insulating interlayer 190 to fill the opening 200. An upper portion of the conductive layer is then planarized until the upper surface of the second insulating interlayer 190 is exposed. A portion of the second blocking layer 250 formed on the upper surface of the second insulating interlayer 190 may be also removed, and the second blocking layer 250 may be converted into a second blocking pattern 255. The conductive layer may include a metal, a metal nitride and/or a metal silicide.

Referring to FIGS. 1, 2A and 2B again, after forming a third insulating interlayer 290 on the second insulating interlayer 190, the CSL 280, the spacer 270 and the second blocking pattern 255, a contact plug 300 may be formed to extend through the third insulating interlayer 290 and the second insulating interlayer 190 and contact an upper surface of the pad 180.

After forming a fourth insulating interlayer 310 on the third insulating interlayer 290 and the contact plug 300, a bit line 320 extending through the fourth insulating interlayer 310 and contacting an upper surface of the contact plug 300 may be formed to complete the fabrication of the vertical memory device.

In an exemplary embodiment, the third and fourth insulating interlayers 290 and 310 may include an oxide, such as silicon oxide, and the contact plug 300 and the bit line 320 may include a metal, such as copper, aluminum, tungsten, titanium, tantalum, etc., and/or a metal nitride, e.g., titanium nitride, tantalum nitride, tungsten nitride, etc. However, exemplary embodiments of the present inventive concepts are not limited thereto.

In an exemplary embodiment, the bit line 320 may extend in the third direction, and a plurality of bit lines 320 may be formed along the second direction.

As described above, the charge trapping pattern structure 235 formed between the gate electrodes and the channel 165 (e.g., in the third direction) may include the upper and lower charge trapping patterns 235a and 235b spaced apart from each other along the first direction by the third portion 220c of the tunnel insulation pattern, so that electrons may be effectively injected through each of the upper and lower charge trapping patterns 235a and 235b, and thus the electrical characteristic of the vertical memory device may be improved.

Also, a plurality of charge trapping pattern structures 235 may be formed to be spaced apart from each other along the first direction, and each of the charge trapping pattern structures 235 may be separated by each of the insulation patterns 115. Accordingly, the interference of neighboring gate electrodes may be minimized, and the occurrence of coupling between the gate electrodes may be reduced.

Figure 16:
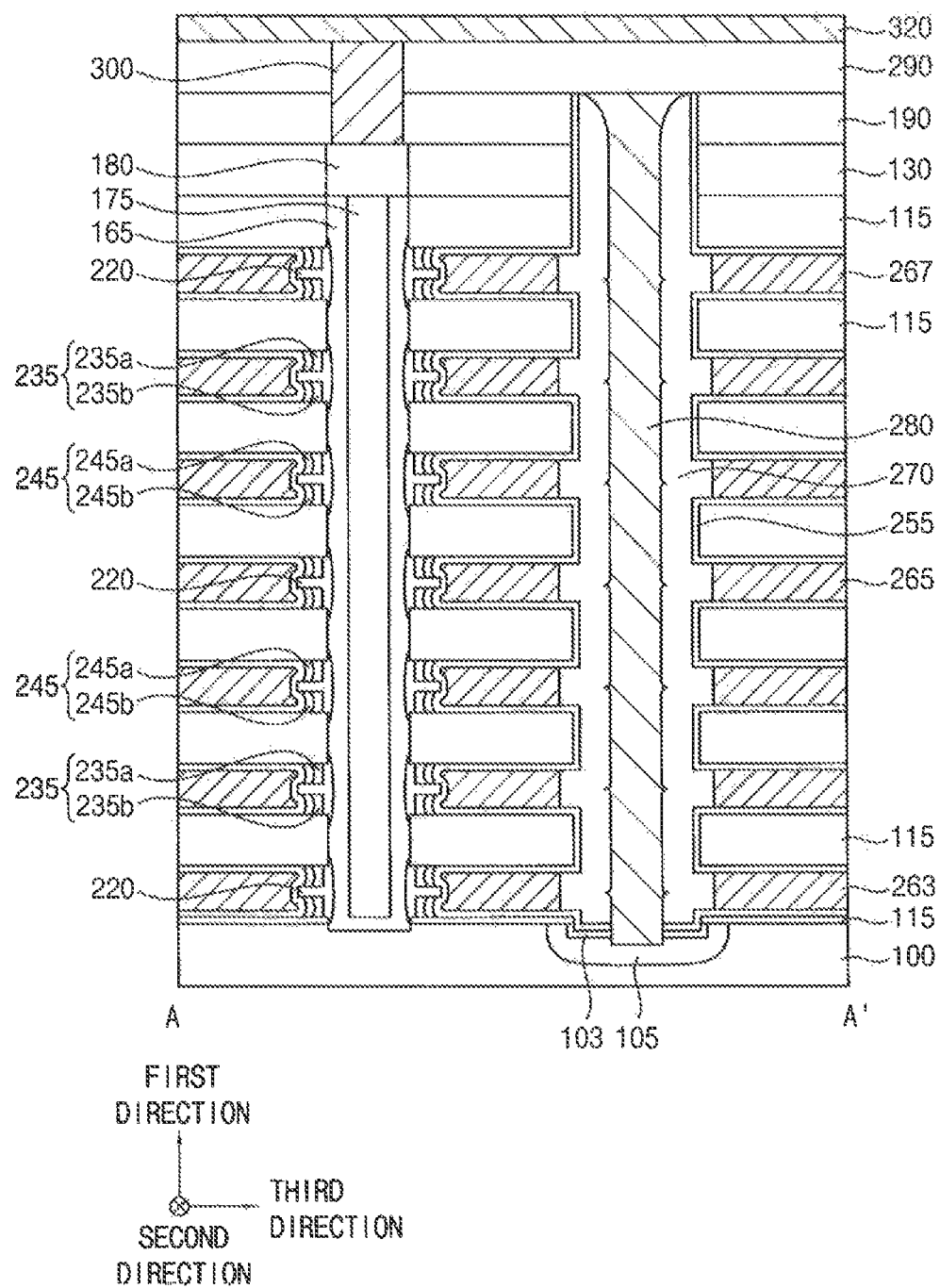

FIG. 16 is a cross-sectional view taken along the line A-A' of FIG. 1 illustrating a vertical memory device in accordance with an exemplary embodiment of the present inventive concepts.

The vertical memory device shown in the exemplary embodiment of FIG. 16 is substantially the same as or similar to the vertical memory device described in FIGS. 1, 2A and 2B, except for the shape of an inner sidewall of the tunnel insulation pattern. Thus, like reference numerals refer to like elements, and detailed descriptions thereon are omitted herein.

Referring to FIG. 16, an inner sidewall of the tunnel insulation pattern 220 contacting the channel 165 may have a varying slope that is not vertical to the upper surface of the substrate 100 (e.g., not extending in the first direction).

In an exemplary embodiment, an upper portion of the inner sidewall of the tunnel insulation pattern 220 may have a slope that an absolute value thereof decreases toward the top. A lower portion of the inner sidewall of the tunnel insulation pattern 220 may have a slope that an absolute value thereof increases toward the bottom, and a remaining portion of the inner sidewall of the tunnel insulation pattern 220 is substantially vertical to the upper surface of the substrate 100. For example, the inner sidewall of the tunnel insulation pattern 220 may be substantially convex towards the channel 165 in the third direction.

Figure 17:
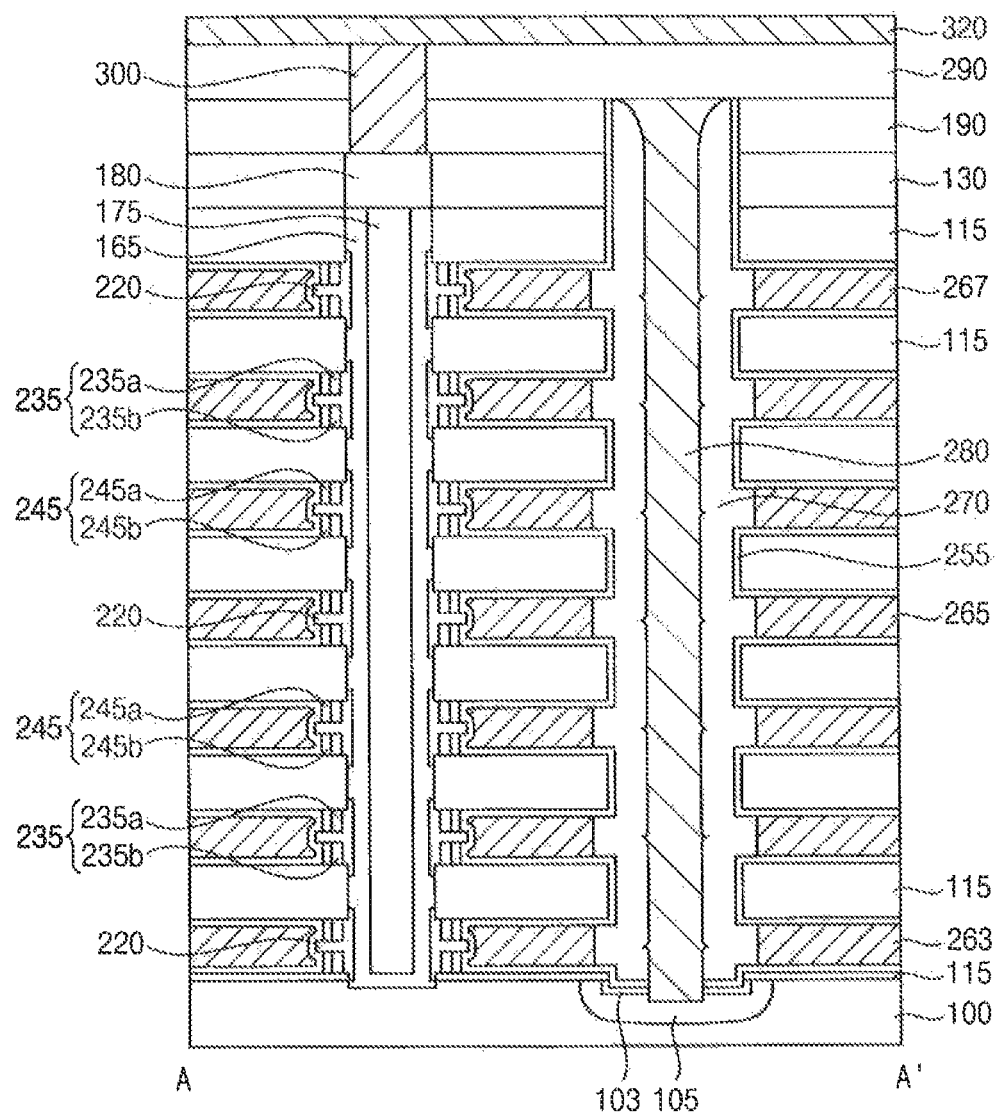
Figure 18:
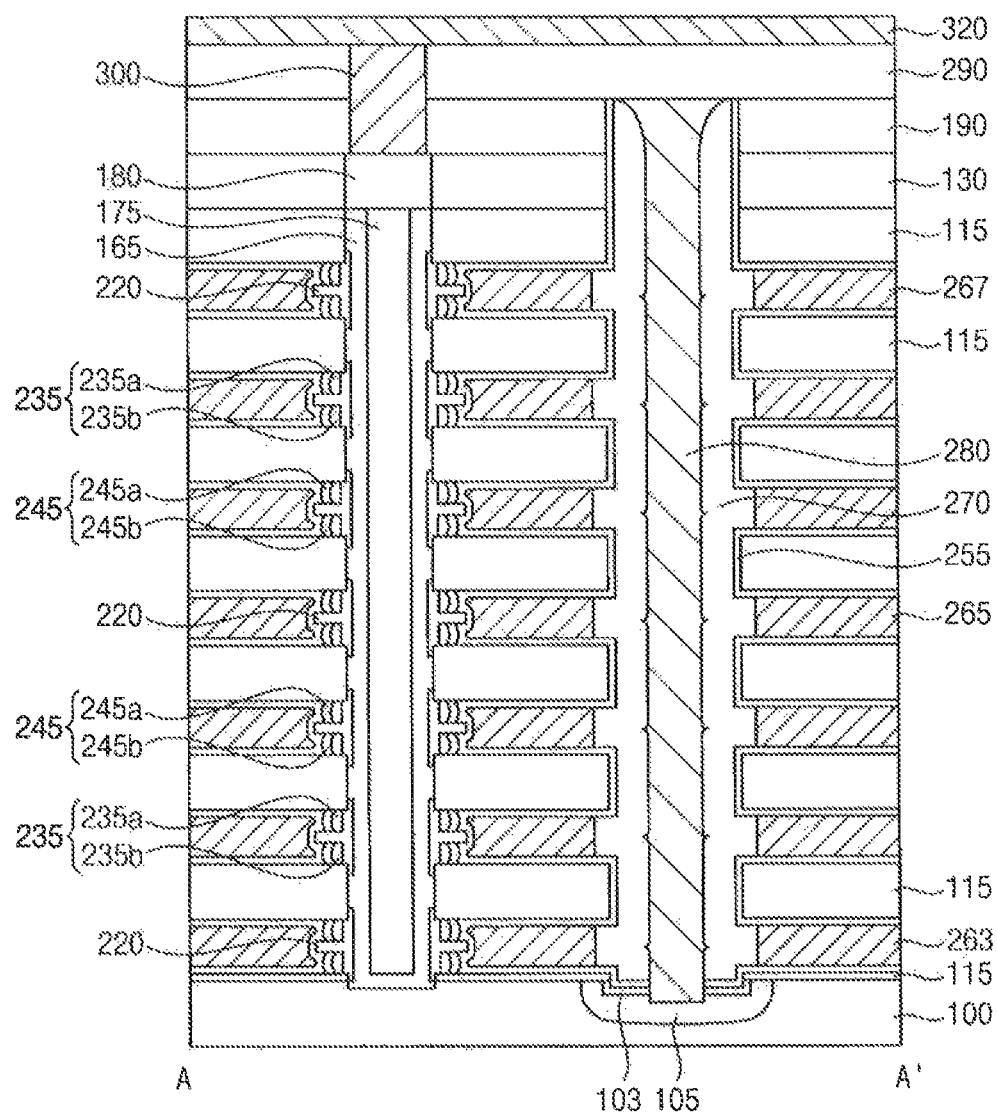

FIGS. 17 and 18 are cross-sectional views illustrating vertical memory devices in accordance with exemplary embodiments of the present inventive concepts. FIGS. 17 and 18 are cross-sectional views taken along the line A-A' of FIG. 1.

The vertical memory devices shown in FIGS. 17 and 18 are substantially the same as or similar to the vertical memory device described in FIGS. 1, 2A and 2B, except for the shapes of each of the charge trapping pattern structure and the blocking pattern structure. Therefore, like reference numerals refer to like elements, and detailed descriptions thereon are omitted herein.

Referring to FIG. 17, each of the upper and lower charge trapping patterns 235a and 235b may have an outer sidewall that is substantially vertical to the upper surface of the substrate 100 (e.g., extending in the first direction), and each of the upper and lower first blocking patterns 245a and 245b may also have an outer sidewall substantially vertical to the upper surface of the substrate 100.

Accordingly, a portion of the second blocking pattern 255 contacting the outer sidewall of the blocking pattern structure 245 may have a sidewall substantially vertical to the upper surface of the substrate 100 (e.g., extending in the first direction).

Referring to FIG. 18, each of the upper and lower charge trapping patterns 235a and 235b may have an outer sidewall of a convex shape along the third direction, and each of the upper and lower first blocking patterns 245a and 245b may also have an outer sidewall of a convex shape along the third direction (e.g., extending towards the channel 165).

Accordingly, a portion of the second blocking pattern 255 contacting the outer sidewall of the blocking pattern structure 245 may have a sidewall having a concave shape.

Figure 19:
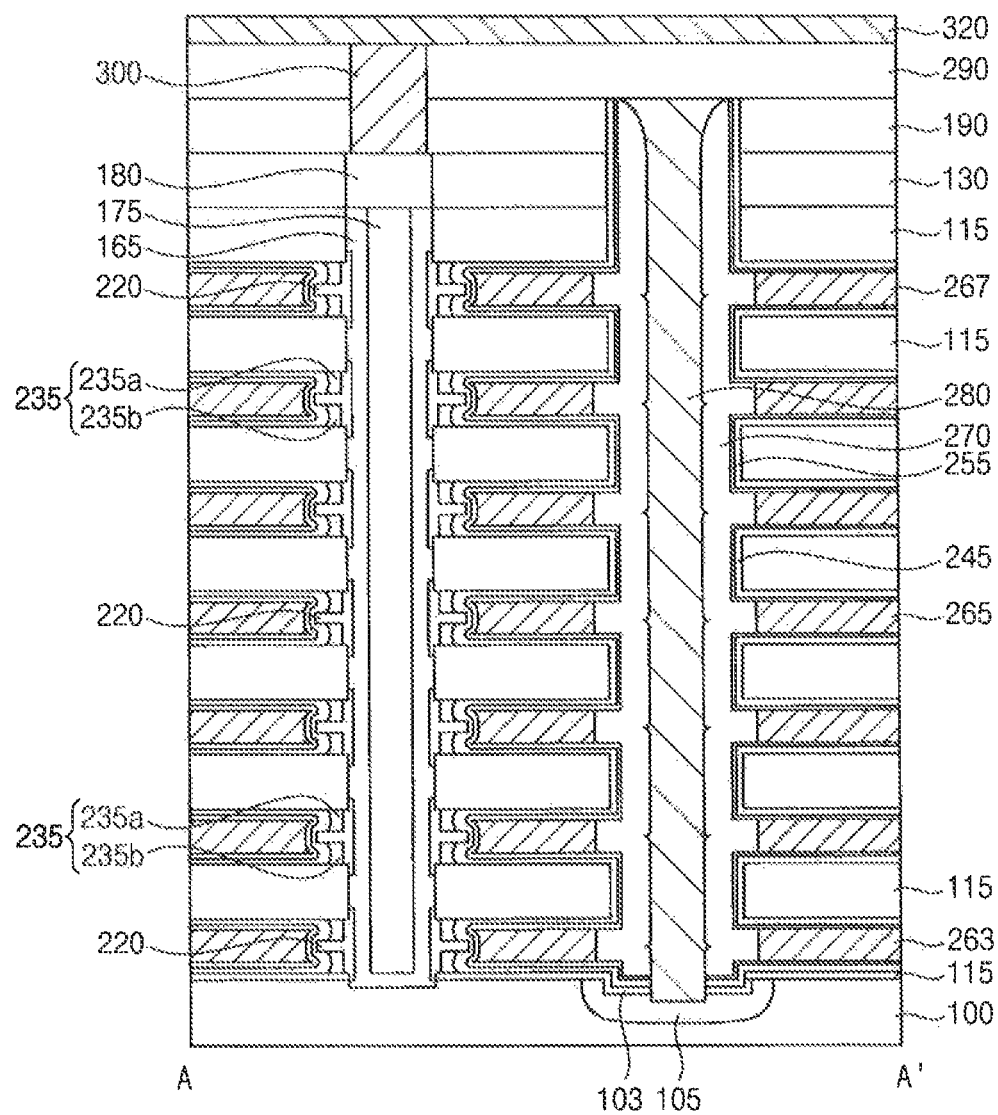

FIG. 19 is a cross-sectional view taken along the line A-A' of FIG. 1 illustrating a vertical memory device in accordance with an exemplary embodiment of the present inventive concepts.

The vertical memory device of FIG. 19 is substantially the same as or similar to the vertical memory device described in FIGS. 1, 2A and 2B, except for the shape of the blocking pattern structure. Thus, like reference numerals refer to like elements, and detailed descriptions thereon are omitted herein.

Referring to FIG. 19, the vertical memory device may be manufactured without performing the process of partially removing the first blocking layer 240 described in FIG. 13 among the processes described in FIGS. 3 to 15, and FIGS. 1, 2A and 2B.

For example, after forming a first blocking layer 240, the first blocking layer 240 may not be partially removed, and a second blocking layer 250 may be formed on the first blocking layer 240. Accordingly, the blocking pattern structure 245 may be formed without being spaced apart from each other in the first direction, and may be referred to as a first blocking pattern 245.

For example, after performing processes substantially the same as or similar to the processes described in FIGS. 3 to 15, the first blocking layer 240 and the second blocking layer 250 may be sequentially formed on the outer sidewall of the tunnel insulation pattern 220, the outer sidewall of the charge trapping pattern structure 235, the upper surface, the lower surface and the sidewall of each of the insulation patterns 115, the oxidation layer 103, and the surfaces of the first and second insulating interlayers 130 and 190 exposed by the opening 200 and the gap 210. A gate electrode layer may then be formed to efficiently fill a remaining portion of the gap 210. The gate electrode layer may be partially removed to form a gate electrode in the gap 210, and processes substantially the same as or similar to the processes described in FIGS. 14 and 15, and FIGS. 1, 2A and 2B may be performed to complete the fabrication of the vertical memory device.

In an exemplary embodiment of the present inventive concepts, the first blocking pattern 245 may cover an upper surface, a lower surface, and a sidewall adjacent to each of the gate electrodes of the protrusion portion of the tunnel insulation pattern 220, and may contact the outer sidewall of the charge trapping pattern structure 235.

FIGS. 20 to 23 are cross-sectional views taken along the line A-A' of FIG. 1 illustrating stages of a method of manufacturing a vertical memory device in accordance with exemplary embodiments of the present inventive concepts.

This method includes processes substantially the same as or similar to the processes described in FIGS. 3 to 15, and FIGS. 1, 2A and 2B. Thus, detailed descriptions thereon are omitted herein.

Figure 20:
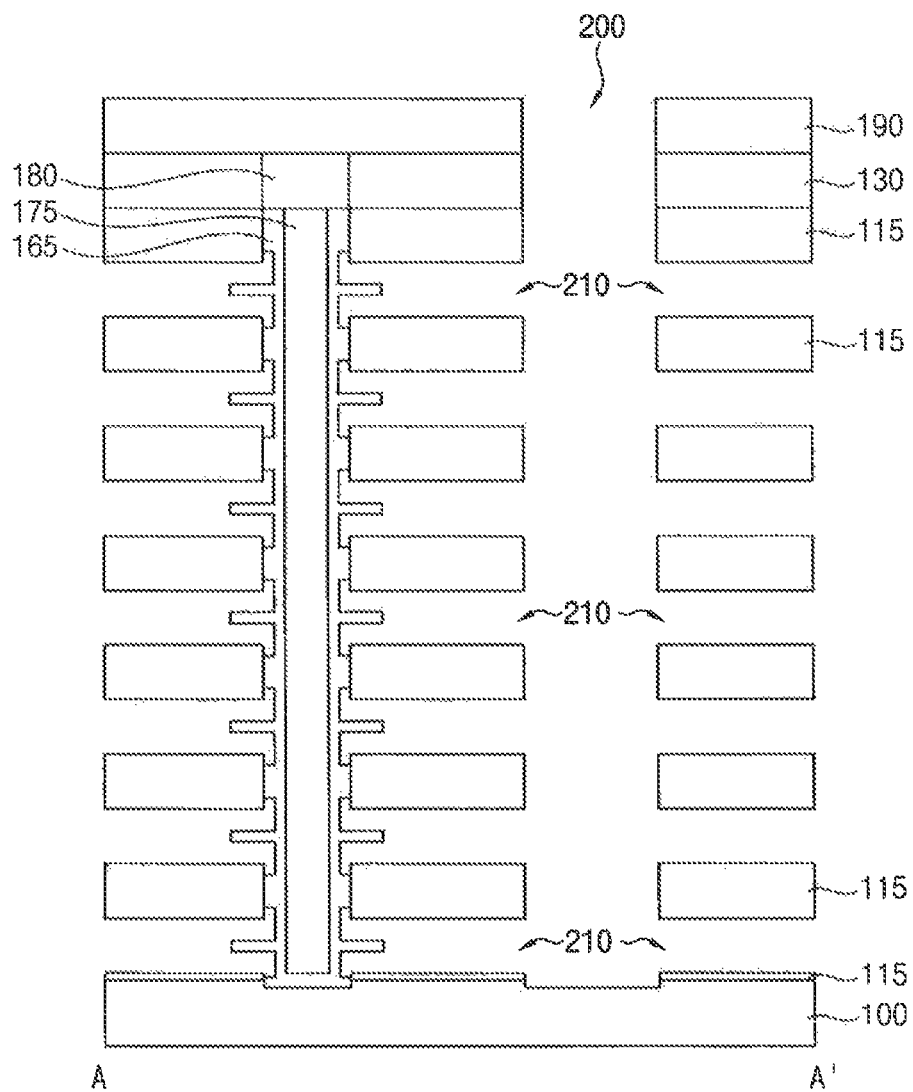

Referring to FIG. 20, an oxidation process may not be performed on the outer sidewall of the channel 165 exposed by the gap 210, and the exposed outer sidewall of the channel 165 may be partially removed.

An etching process may be formed to reduce only the size of the protrusion portion of the outer sidewall of the channel 165 without completely removing the protrusion portions, and thus the channel 165 may have a concave-convex shape even after the etching process. However, after the etching process, the thickness (e.g., length in the third direction) of the portion of the channel 165 exposed by the gap 210 may be smaller than other portion thereof.

In an exemplary embodiment, the etching process may include a process to selectively remove polysilicon or amorphous silicon.

Figure 21:
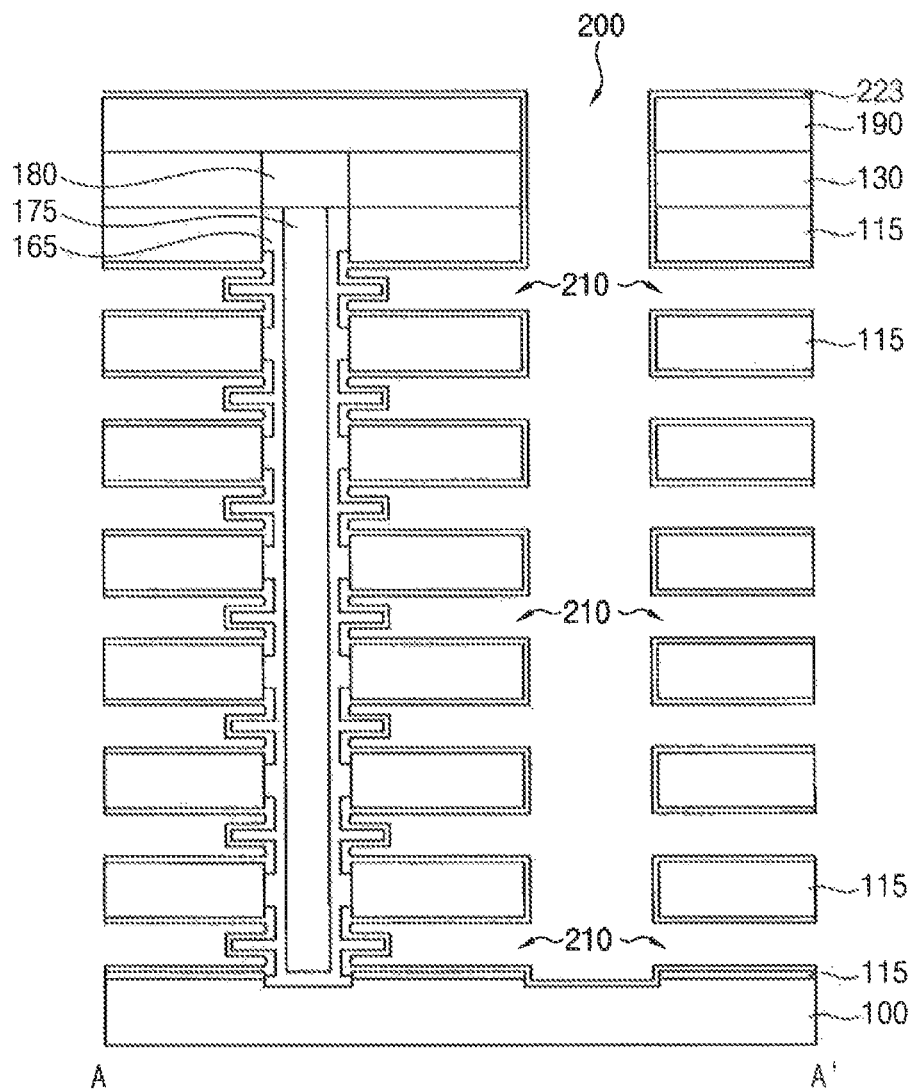

Referring to the exemplary embodiment shown in FIG. 21, the tunnel insulation layer 223 may be conformally formed.

Accordingly, the oxidation layer 103 may not be formed on the upper surface of the substrate 100 exposed by the opening 200.

In an exemplary embodiment, the tunnel insulation layer 223 may include an oxide, such as silicon oxide, and may be integrally formed along the first direction and the third direction. However, exemplary embodiments of the present inventive concepts are not limited thereto.

Since the tunnel insulation layer 223 may be formed to cover the protrusion portion of the outer sidewall of the channel 165 having the reduced size, the tunnel insulation layer 223 may have a shape protruding in the third direction on an inner space of the gap between neighboring insulation patterns 115.

In an exemplary embodiment, the tunnel insulation layer 223 may have a uniform thickness as a whole. However, the tunnel insulation layer 223 may have a relatively larger thickness on the portion of the outer sidewall of the channel 165 exposed by the gap 210.

Figure 22A:
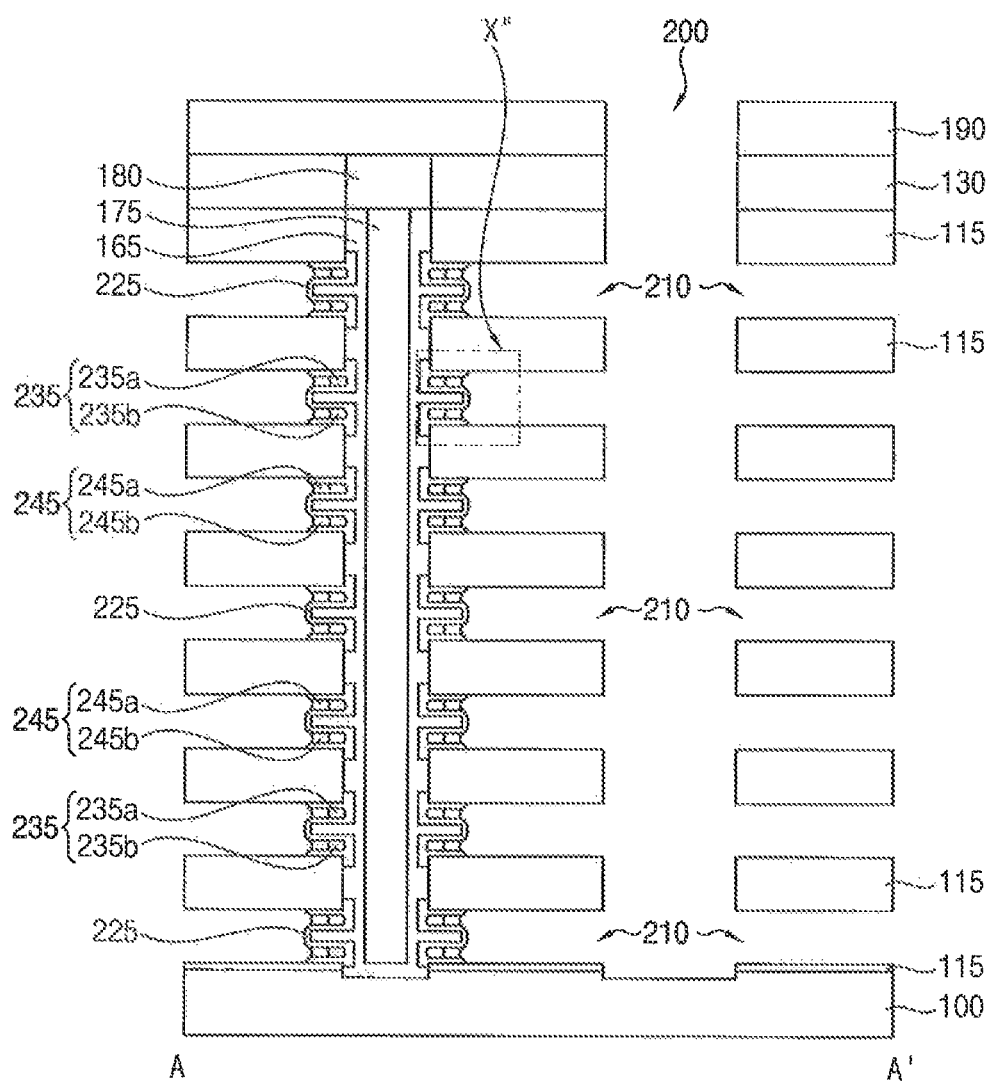
Figure 22A:
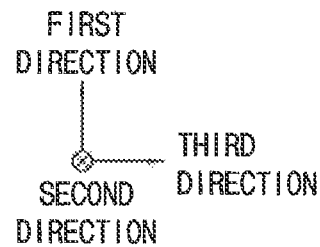
Figure 22B:
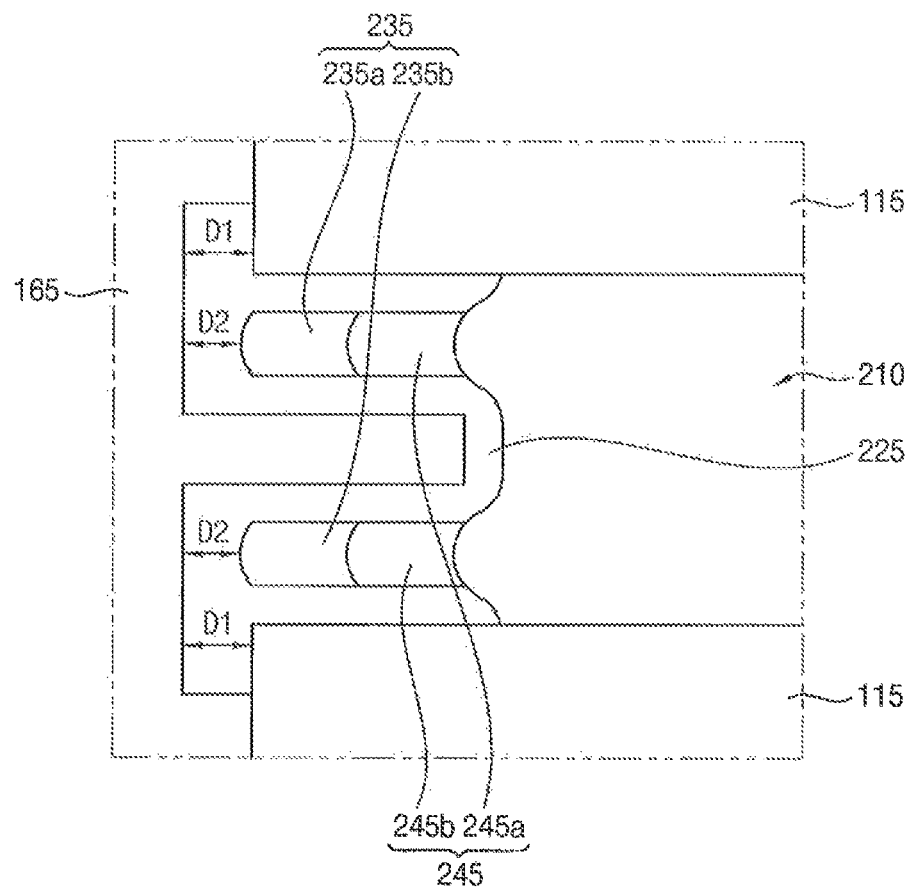
FIG. 22B is an enlarged view of region X" shown in FIG. 22A according to an exemplary embodiment of the present inventive concepts.

Referring to FIGS. 22A and 22B, processes substantially the same as or similar to the processes described in FIGS. 10 to 13 may be performed.

After conformally forming a charge trapping layer 230 on the outer sidewall of the tunnel insulation pattern 220, the upper surface, the lower surface and the sidewall of each of the insulation patterns 115, and surfaces of each of the first and second insulating interlayers 130 and 190, the charge trapping layer 230 may be partially removed to form a charge trapping pattern structure 235. A first blocking layer 240 may then be conformally formed on the outer sidewall of the tunnel insulation pattern 220, an outer sidewall of the charge trapping pattern structure 235, the upper surface, the lower surface and the sidewall of each of the insulation patterns 115, and surfaces of each of the first and second insulating interlayers 130 and 190. The first blocking layer 240 may then be partially etched to form a blocking pattern structure 245.

When the first blocking layer 240 is partially etched, the tunnel insulation layer 223 may also partially removed, and thus a tunnel insulation pattern 225 may be formed.

In an exemplary embodiment, an uppermost surface of the tunnel insulation pattern 225 may be higher (e.g., in the first direction) than the bottom surface of the insulation pattern 115 formed thereon, and a lowermost surface of the tunnel insulation pattern 220 may be lower (e.g., in the first direction) than a top surface of the insulation pattern 115 formed thereunder.

In an exemplary embodiment, an upper surface, a lower surface and an inner sidewall adjacent to the channel 165 of the upper charge trapping pattern 235a may be covered by the tunnel insulation pattern 225. An upper surface and a lower surface of the upper first blocking pattern 245a may be covered by the tunnel insulation pattern 225. An upper surface, a lower surface and an inner sidewall adjacent to the channel 165 of the lower charge trapping pattern 235b may be covered by the tunnel insulation pattern 225. An upper surface and a lower surface of the lower first blocking pattern 245b may be covered by the tunnel insulation pattern 225.

In an exemplary embodiment, the upper surface and the lower surface of the upper charge trapping pattern 235a may be formed at substantially the same height as the upper surface and the lower surface of the upper first blocking pattern 245a, and the upper surface and the lower surface of the lower charge trapping pattern 235b may be formed at substantially the same height as the upper surface and the lower surface of the lower first blocking pattern 245b.

In an exemplary embodiment, a first distance D1 that is the shortest distance (e.g., in the third direction) between the channel 165 and the insulation pattern 115 having the tunnel insulation pattern 225 interposed therebetween may be larger than a second distance D2 that is the shortest distance between the channel 165 and the charge trapping pattern structure 235 having the tunnel insulation pattern 225 interposed therebetween. However, exemplary embodiments of the present inventive concepts are not limited thereto, and the first distance D1 may be smaller than the second distance D2, or the first and second distances D1 and D2 may be substantially the same as each other.

In an exemplary embodiment of the present inventive concepts, the outer sidewall of the tunnel insulation pattern 225 and the outer sidewall of the blocking pattern structure 245 exposed by the gap 210 altogether may have a concave-convex shape.

Figure 23:
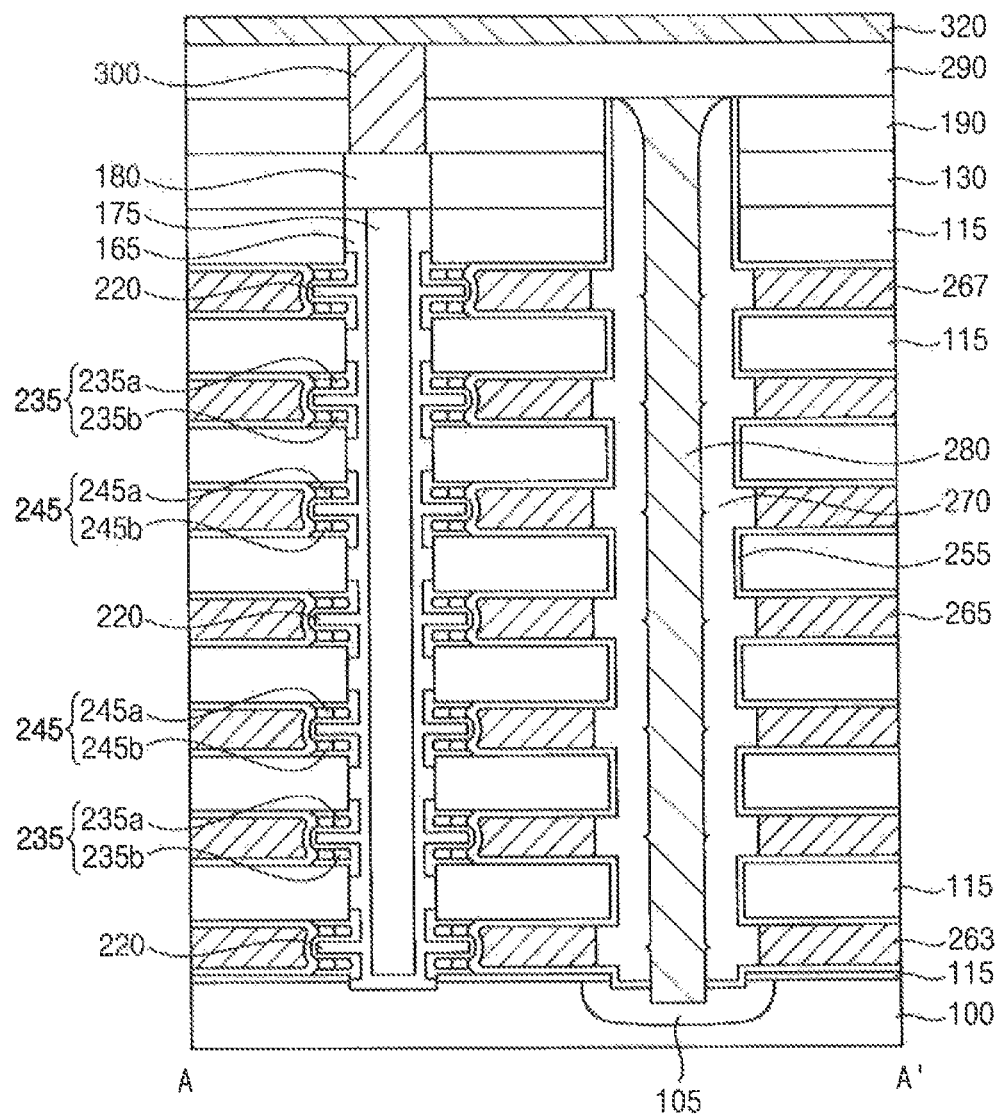
Figure 23:
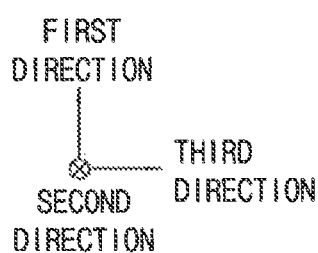

Referring to FIG. 23, processes substantially the same as or similar to the processes described in FIGS. 14 and 15, and FIGS. 1, 2A and 2B may be performed to complete the fabrication of the vertical memory device.

Since the outer sidewall of the tunnel insulation pattern 225 and the outer sidewall of the blocking pattern structure 245 exposed by the gap 210 altogether may have the concave-convex shape, the sidewall of each of the gate electrodes adjacent thereto may also have a concave-convex shape.

As described above, although the present inventive concepts have been described with reference to exemplary embodiments, those skilled in the art will readily appreciate that many modifications are possible in the exemplary embodiments without materially departing from the novel teachings and advantages of the present inventive concepts.

What is claimed is:

1. A vertical memory device, comprising:
   gate electrodes disposed on a substrate and spaced apart from each other in a vertical direction substantially perpendicular to an upper surface of the substrate;
   a channel extending in the vertical direction and positioned adjacent to the gate electrodes;
   a tunnel insulation pattern disposed on a portion of an outer sidewall of the channel, the portion of the outer sidewall of the channel being adjacent to each of the gate electrodes;
   charge trapping pattern structures disposed between the tunnel insulation pattern and each of the gate electrodes, each of the charge trapping pattern structures including upper and lower charge trapping patterns spaced apart from each other in the vertical direction; and
   blocking pattern structures disposed between the charge trapping patterns and each of the gate electrodes,
   wherein a first portion of the channel that is adjacent to the tunnel insulation pattern in a horizontal direction substantially parallel to the upper surface of the substrate has a thickness in the horizontal direction that is smaller than a thickness in the horizontal direction of a second portion of the channel that is not adjacent to the tunnel insulation pattern in the horizontal direction.

2. The vertical memory device of claim 1, wherein the tunnel insulation pattern includes a protrusion portion that protrudes in the horizontal direction towards an adjacent gate electrode farther than any other portion of the tunnel insulation pattern.

3. The vertical memory device of claim 2, wherein:
   the protrusion portion of the tunnel insulation pattern is formed on a central portion of the tunnel insulation pattern in the vertical direction, and
   the upper and lower charge trapping patterns are spaced apart from each other in the vertical direction by the protrusion portion.

4. The vertical memory device of claim 2, wherein:
   each of the blocking pattern structures includes upper and lower first blocking patterns spaced apart from each other in the vertical direction; and
   the upper and lower first blocking patterns are spaced apart from each other in the vertical direction by the protrusion portion.

5. The vertical memory device of claim 4, Wherein an outer sidewall of each of the upper and lower first blocking patterns has a concave shape along the horizontal direction.

6. The vertical memory device of claim 1, wherein:
   the tunnel insulation pattern includes first to, third portions sequentially stacked from the outer sidewall of the channel along the horizontal direction, the first portion has a first width in the vertical direction, the second portion has a second width in the vertical direction and the third portion has a third width in the vertical direction; and
   the first width is greater than the second width, and the second width is greater than the third width.

7. The vertical memory device of claim 6, wherein:
   an inner sidewall of the first portion of the tunnel insulation pattern contacts the channel and extends in the vertical direction; and
   the third portion of the tunnel insulation pattern protrudes from the second portion in the horizontal direction towards an adjacent gate electrode.

8. The vertical memory device of claim 1, wherein an outer sidewall of each of the upper and lower charge trapping patterns has a concave shape along the horizontal direction.

9. The vertical memory device of claim 1, wherein the tunnel insulation pattern includes a plurality of tunnel insulation patterns that are spaced apart from each other in the vertical direction.

10. The vertical memory device of claim 9, wherein:
    an uppermost surface of the tunnel insulation pattern is higher than an uppermost surface of the charge trapping pattern structure and an uppermost surface of the blocking pattern structure corresponding thereto; and
    a lowermost surface of the tunnel insulation pattern is lower than a lowermost surface of the charge trapping pattern structure and a blocking pattern structure corresponding thereto.

11. The vertical memory device of claim 1, further comprising:
    a second blocking pattern covering upper and lower surfaces, and one sidewall of each of the gate electrodes, the one sidewall of the gate electrodes is adjacent to the channel,
    wherein the second blocking pattern directly contacts the tunnel insulation pattern and the blocking pattern structure.

12. The vertical memory device of claim 1, wherein one sidewall of each of the gate electrodes that is adjacent to the channel is concave along the horizontal direction.

13. A vertical memory device, comprising:
- gate electrodes disposed on a substrate and spaced apart from each other in a vertical direction substantially perpendicular to an upper surface of the substrate;
- a channel extending in the vertical direction, and positioned adjacent to the gate electrodes, the channel including a protrusion portion that protrudes in a horizontal direction substantially parallel to the upper surface of the substrate toward each of the gate electrodes;
- a tunnel insulation pattern disposed on a portion of an outer sidewall of the channel adjacent to each of the gate electrodes and the protrusion portion of the channel in the horizontal direction;
- charge trapping pattern structures disposed between the tunnel insulation pattern and each of the gate electrodes, each of the charge trapping pattern structures including upper and lower charge trapping patterns spaced apart and separated from each other in the vertical direction by the tunnel insulation pattern; and
- blocking pattern structures disposed between the charge trapping patterns and each of the gate electrodes,
- wherein a sidewall of each of the gate electrodes adjacent to the channel is concave along the horizontal direction.

14. The vertical memory device of claim 13, further comprising:
- a second blocking pattern covering upper and lower surfaces, and one sidewall of each of the gate electrodes, the one sidewall of the gate electrodes is adjacent to the channel,
- wherein the second blocking pattern directly contacts the tunnel insulation pattern and the blocking pattern structure.

15. The vertical memory device of claim 14, wherein:
- the blocking pattern structure includes upper and lower first blocking patterns spaced apart from each other in the vertical direction; and
- the upper and lower first blocking patterns are surrounded by the tunnel insulation pattern, the charge trapping pattern and the second blocking pattern.

16. A vertical memory device, comprising:
- gate electrodes disposed on a substrate and spaced apart from each other in a vertical direction substantially perpendicular to an upper surface of the substrate;
- a channel extending in the vertical direction and positioned adjacent to the gate electrodes, the channel having recesses formed on portions of an outer sidewall of the channel adjacent to each of the gate electrodes, the recesses spaced apart from each other in the vertical direction;
- a tunnel insulation pattern filling each of the recesses, and protruding toward each of the gate electrodes in a horizontal direction substantially parallel to the upper surface of the substrate;
- charge trapping pattern structures disposed between the tunnel insulation pattern and each of the gate electrodes, each of the charge trapping pattern structures including upper and lower charge trapping patterns spaced apart and separated from each other in the vertical direction by the tunnel insulation pattern; and
- blocking pattern structures disposed between the charge trapping patterns and each of the gate electrodes.

17. The vertical memory device of claim 16, wherein, the tunnel insulation pattern includes:
- a first portion filling each of the recesses of the channel;
- a second portion disposed on the first portion, the second portion having a second width in the horizontal direction that is smaller than a first width in the horizontal direction of the first portion; and
- a third portion disposed on the second portion, the third portion having a third width in the horizontal direction that is smaller than the first width.

18. The vertical memory device of claim 17, wherein the upper and lower charge trapping patterns are spaced apart and separated from each other in the vertical direction by the third portion of the tunnel insulation pattern.

19. The vertical memory device of claim 16, wherein:
- the blocking pattern structure includes upper and lower first blocking patterns that are spaced apart from each other in the vertical direction; and
- the upper and lower first blocking patterns are spaced apart from each other by the tunnel insulation pattern.

20. The vertical memory device of claim 16, further comprising:
- a second blocking pattern covering upper and lower surfaces, and one sidewall of each of the gate electrodes, the one sidewall of the gate electrodes being adjacent to the channel,
- wherein the second blocking pattern directly contacts the tunnel insulation pattern and the blocking pattern structure.

* * * * *